United States Patent [19]

Sato et al.

[11] Patent Number: 5,388,067
[45] Date of Patent: Feb. 7, 1995

[54] SEMICONDUCTOR MEMORY CELL

[75] Inventors: Nolifumi Sato; Manabu Ando, both of Tokyo, Japan

[73] Assignee: NEC Corporation, Tokyo, Japan

[21] Appl. No.: 221,698

[22] Filed: Apr. 1, 1994

[30] Foreign Application Priority Data

Apr. 1, 1993 [JP] Japan ................................ 5-075978

[51] Int. Cl.⁶ ............................................ G11C 13/00
[52] U.S. Cl. ..................................... 365/154; 365/53; 365/189.01; 365/189.05
[58] Field of Search ..................... 365/53, 154, 189.01, 365/230.01, 189.05, 230.08

[56]  References Cited

U.S. PATENT DOCUMENTS 5,299,156  3/1994  Jiang et al. ........................ 365/154

FOREIGN PATENT DOCUMENTS 1-166554  6/1989  Japan .
1-202858  8/1989  Japan .

Primary Examiner—Terrell W. Fears

[57] ABSTRACT

A flip-flop is composed of inverters including first and second MISFETs each comprising a TFT or an SOI transistor. A third MISFET, which comprises a TFT or an SOI transistor, has a gate connected to a write selecting signal line, and is connected between the output terminal of one of the inverters and a write/read signal line. A fourth MISFET has a gate connected to the gate of the other inverter. A fifth MISFET has a drain and a source connected to the write/read signal line and the drain of the fourth MISFET, and a gate connected to a read selecting signal line.

12 Claims, 28 Drawing Sheets

F I G. 12
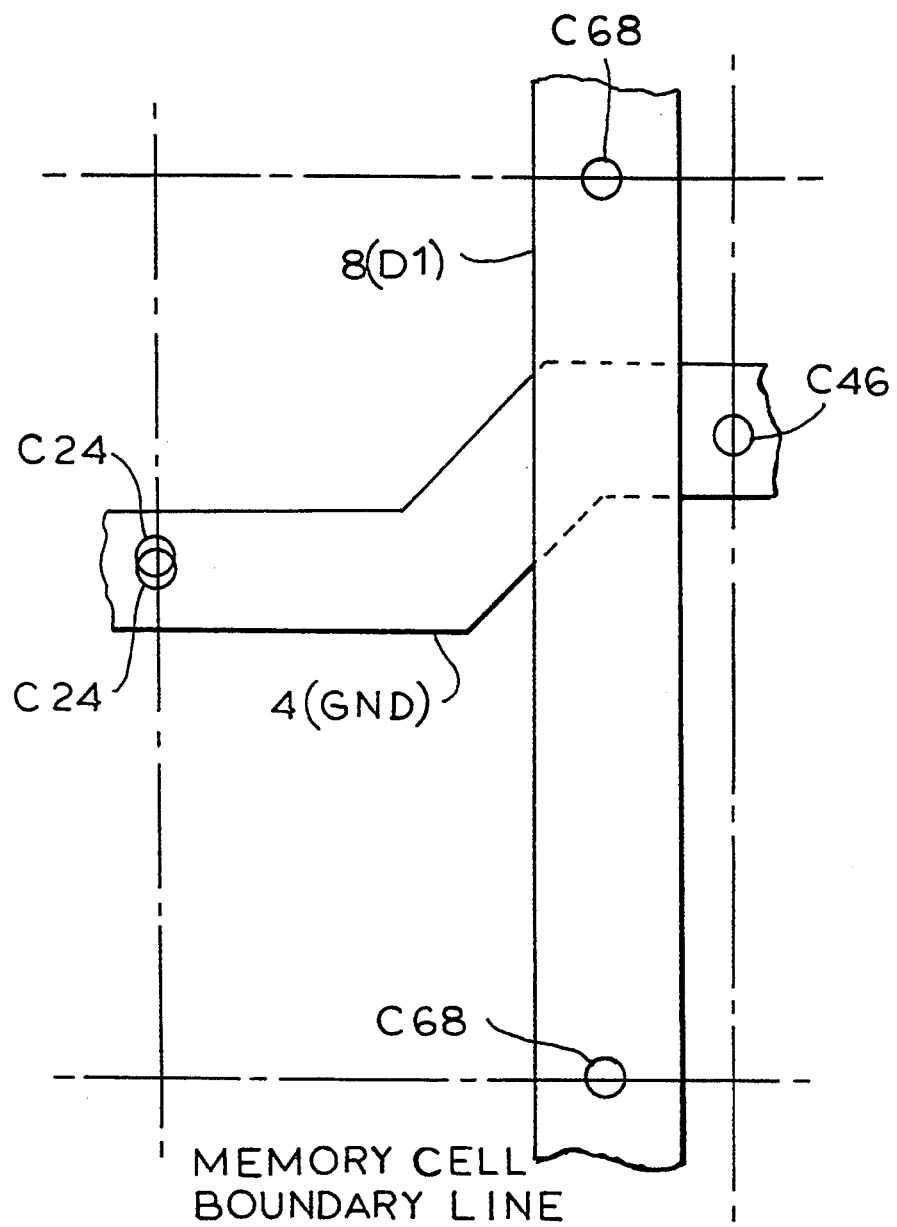

F I G. 14
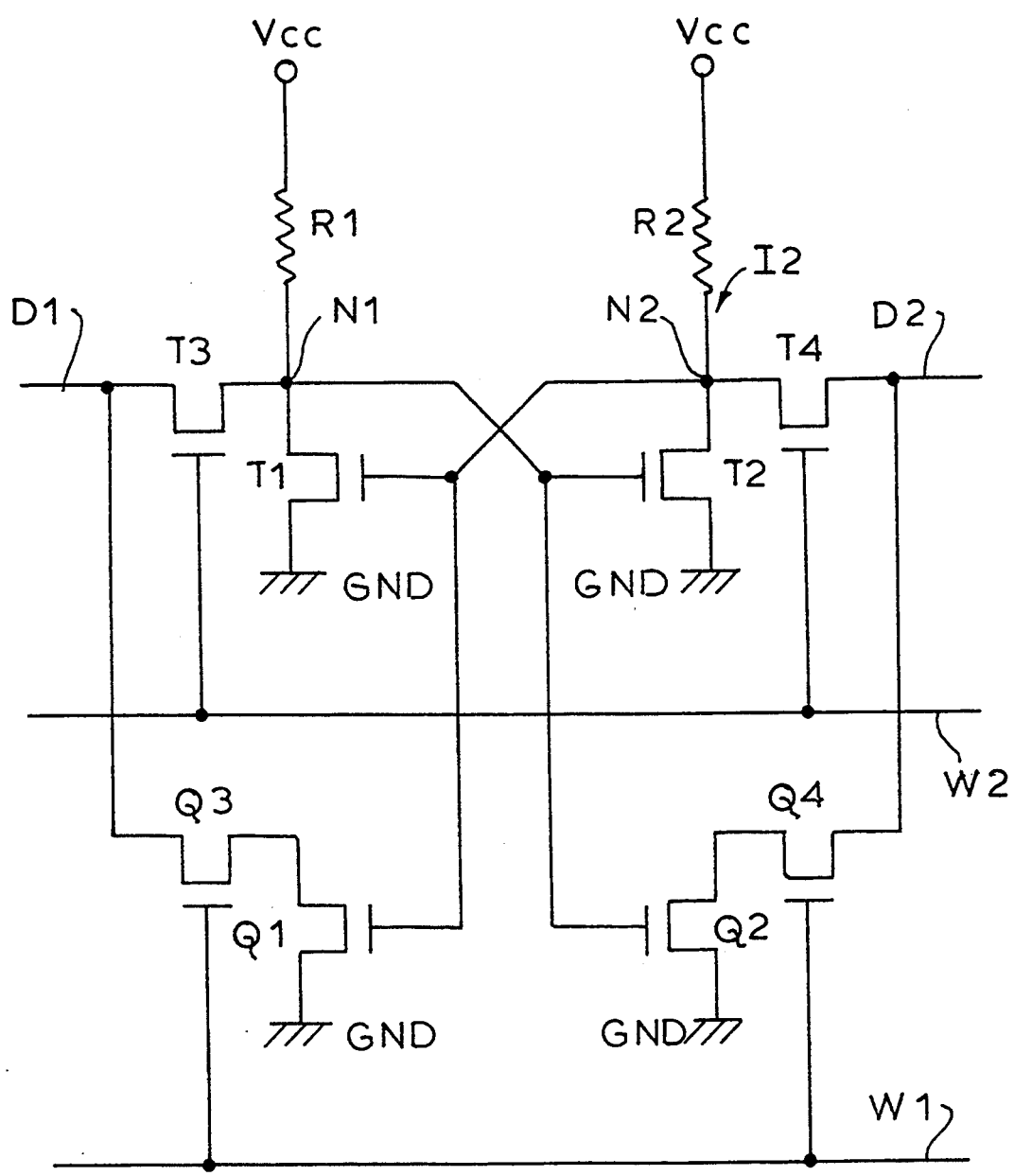

F I G. 17
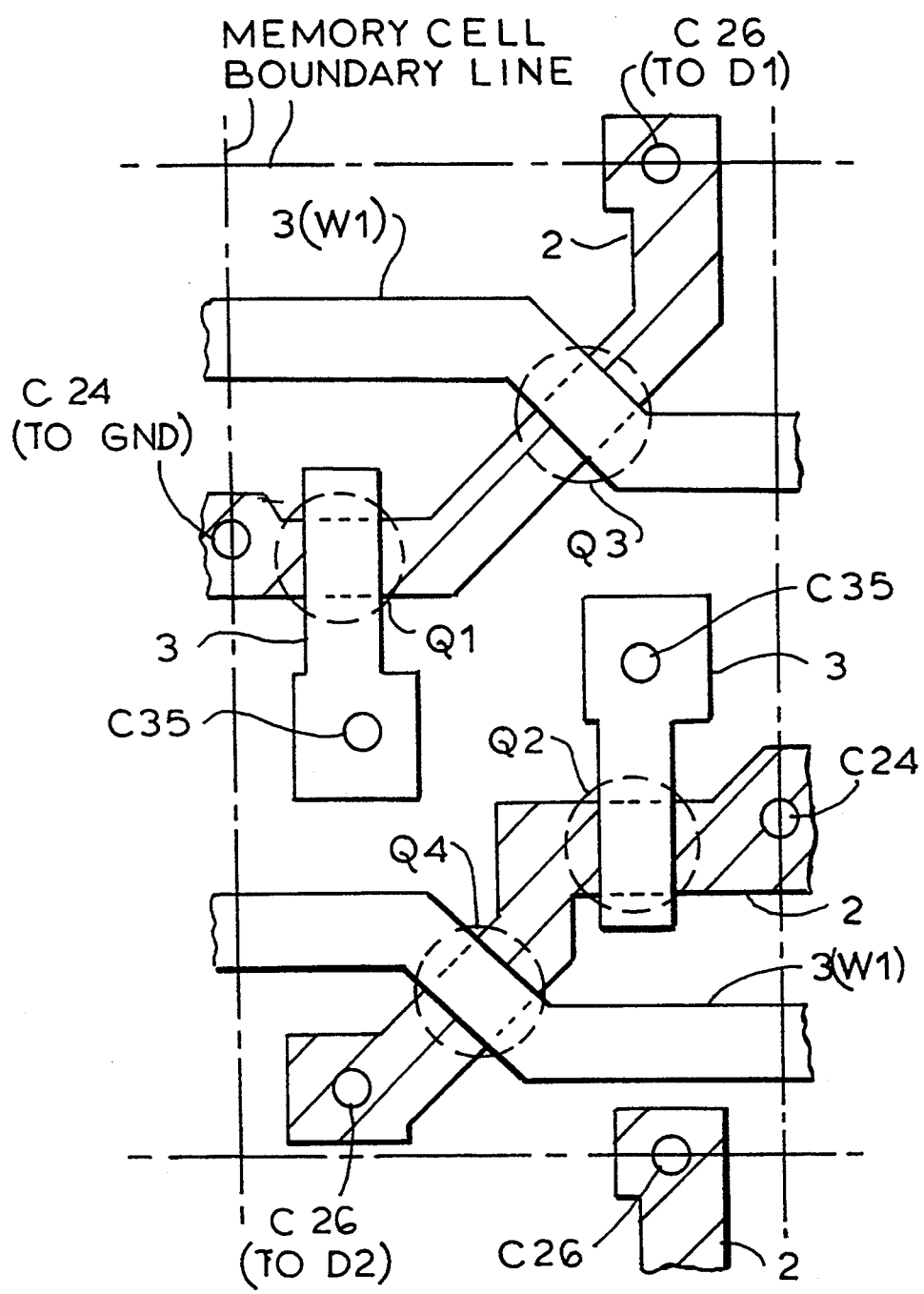

MEMORY CELL
BOUNDARY LINE

MEMORY CELL BOUNDARY LINE

SEMICONDUCTOR MEMORY CELL

BACKGROUND OF THE INVENTION

1. Field of the Invention

The present invention relates to a semiconductor memory cell, and more particularly to a memory cell for a static random-access memory.

2. Description of the Prior Art

Conventional silicon LSI circuits include a static random-access memory (SRAM) composed of memory cells each comprising flip-flops coupled in a cross connection for storing data. Each of the memory cells has two storage nodes each including a region in which an impurity is diffused in a silicon substrate. The impurity-diffused region serves as the source or drain of a metal-insulator-silicon field effect transistor (MISFET). A MISFET whose source or drain is composed of a region where an impurity is diffused in a silicon substrate will hereinafter be referred to as an "intrasubstrate MISFET". The intrasubstrate MISFET has a gate electrode disposed over the silicon substrate with a silicon oxide film interposed therebetween, the silicon oxide film having a thickness in the range of from 10 nm to several tens nm.

Other than the intrasubstrate MISFET, there is also known a MISFET where a polycrystalline silicon film disposed over a substrate with one or more insulating films interposed therebetween is used as a source, a drain, and a channel. Such a MISFET is called a thin-film transistor (TFT). Recent years have seen many research and development efforts directed to TFTs.

While the TFT has its source, drain, and channel formed of a polycrystalline silicon film, a thin-film transistor whose channel substantially comprises a single crystal is called silicon-on-insulator (SOI) transistor, which has also been the subject of recent research and development attempts.

There has been reported an example in which P-channel TFTs are used as two load elements of flip-flops in a memory cell of an SRAM.

One example of an SRAM which has storage nodes in impurity-diffused regions in a substrate and uses P-channel TFTs as load elements is disclosed in Japanese Patent Laid-Open No. 202858/89 and Japanese Patent Laid-Open No. 166554/89.

One conventional SRAM memory cell will be described below with reference to FIGS. 1 through 5.

As shown in FIG. 1, the SRAM memory cell has an inverter I3 comprising a drive N-channel intrasubstrate MISFET Q5 and a load P-channel TFT P1, and an inverter I4 comprising a drive N-channel intrasubstrate MISFET Q6 and a load P-channel TFT P2. The inverter I3 includes a parasitic Schottky diode S1 connected between the drive N-channel intrasubstrate MISFET Q5 and the load P-channel TFT P1, and the inverter I4 includes a parasitic Schottky diode S2 connected between the drive N-channel intrasubstrate MISFET Q6 and the load P-channel TFT P2. These inverters I3, I4 have input and output terminals coupled in a cross connection for storing complementary potentials of "H" or "L" in two storage nodes N1, N2. When the stored information is not to be read from the memory cell or no information is to be written in the memory cell, the potential of a word line W is kept at a ground level to turn off two transfer N-channel intrasubstrate MISFETs Q7, Q8. To read the stored information from the memory cell or write some information in the memory cell, the potential of the word line W raised to a power supply potential level to turn on the MISFETs Q7, Q8 for reading or writing information through signal lines D1A, D2A.

FIG. 2 of the accompanying drawings is a plan view of all conductive layers of the memory cell shown in FIG. 1, and FIG. 3 of the accompanying drawings is a cross-sectional view taken along line III—III of FIG. 2. As shown in FIGS. 2 and 3, the memory cell includes a P-type silicon substrate 1, N-type impurity-diffused regions 2, conductive films 3 serving as the gate electrodes of N-channel intrasubstrate MISFETs, and conductive films 5 serving as the gate electrodes of P-channel TFTs. As shown in FIG. 5 of the accompanying drawings, a power supply potential interconnection 6A$b$ (Vcc), sources 6A$b$, drains 6A$b$, and channels 6A$a$ of the P-channel TFTs are composed of one polycrystalline silicon film. The signal lines D1A, D2A comprise aluminum interconnections 8. Connection holes C23, C25, C28, C36A interconnect the N-type impurity-diffused regions 2 and the conductive films 3, the N-type impurity-diffused regions 2 and the conductive films 5, the N-type impurity-diffused regions 2 and the aluminum interconnections 8, and the N-type impurity-diffused regions 2 and the drains 6A$b$.

FIGS. 4 and 5 of the accompanying drawings show some of the conductive layers shown in FIG. 2. Specifically, FIG. 4 shows the N-type impurity-diffused regions 2 and the conductive films 3, whereas FIG. 5 shows the conductive films 5 and the power supply potential interconnection 6A$b$, the drains 6A$b$, and the channels 6A$a$ in the form of a polycrystalline silicon film. In FIG. 5, the polycrystalline silicon film includes regions 6A$a$ where no boron ions are injected and which serve as the channels of the P-channel TFTs, and regions 6A$b$ where boron ions are injected and which serve as the power supply potential interconnection, the sources and the drains of the P-channel TFTs.

Since the intrasubstrate MISFETs are employed in the flip-flops of the conventional SRAM memory cell, the storage nodes necessarily contain impurity-diffused regions in the substrate.

Uranium nuclides that are contained in a minute quantity in the package material of the LSI and the aluminum interconnection material produce alpha particles when they decay. When alpha particles pass through a substance, they cause ionization along the path of their travel.

If alpha particles pass through an impurity-diffused region when the storage node containing that impurity-diffused region is in an "H" state, then a potential change occurs in the impurity-diffused region and its surrounding region due to the ionization caused by the alpha particles. If electric charges collected by the potential change exceed a certain level, the storage node changes from the "H" state to an "L" state, thus destroying the information stored in the storage node. It is known that this phenomenon is primarily responsible for soft errors of the SRAM.

Such soft errors caused by alpha particles are unavoidable in those SRAMs which employ intrasubstrate MISFETs in flip-flops. Even though the quantity of uranium and thorium nuclides contained in LSI materials is greatly reduced at present because the purity of LSI materials is highly improved, soft errors are still causing serious problems with respect to the reliability of SRAMs in actual usage.

If flip-flops are constructed with TFTs or SOI transistors used as drive elements, then storage nodes may not contain impurity-diffused regions in a substrate. However, inasmuch as TFTs or SOI transistors do not have a sufficient current drive capability as compared with intrasubstrate MISFETs of the same size, if TFTs or SOI transistors are used in the conventional circuit arrangement, then the resultant memory cell is poor regarding the speed at which stored information is read from the memory cell.

SUMMARY OF THE INVENTION

It is therefore an object of the present invention to provide a semiconductor memory cell for use in an SRAM which is highly resistant to alpha rays and has a high readout speed.

To achieve the above object, there is provided in accordance with the present invention a semiconductor memory cell comprising a flip-flop having a first inverter composed of a first MISFET and a first load element and a second inverter composed of a second MISFET and a second load element, the first and second inverters having input terminals connected to the output terminals of the second and first inverters, respectively, a third MISFET having a source and a drain, one of which is connected to the output terminal of the first or second inverter, a fourth MISFET having a gate connected to the output terminal of the second or first inverter, a fifth MISFET having a drain and a source connected to the other of the source and drain of the third MISFET and the drain of the fourth MISFET Q1, respectively, fixed potential supply means for supplying a fixed potential to the source of the fourth MISFET Q1, a read selecting signal line connected to the gate of the fifth MISFET, a write selecting signal line connected to the gate of the third MISFET, and a first write/read signal line connected to the other of the source and drain of the third MISFET T3, each of the first MISFET, the second MISFET, and the third MISFET being a TFT or an SOI transistor.

Since the transistors connected to the storage nodes of the SRAM memory cell comprise TFTs or SOI transistors, the frequency of soft errors caused upon being irradiated with alpha particles is reduced. The intrasubstrate transistors can be turned on and off depending on the state of the flip-flop, and the on/off state of these transistors can be read through the other intrasubstrate transistor, resulting in an increased speed for reading the stored information.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 12 is a plan view of the SRAM memory cell showing a portion of FIG. 7;

FIG. 14 is a circuit diagram of an SRAM memory cell according to a second embodiment of the present invention;

FIG. 17 is a plan view of the SRAM memory cell showing a portion of FIG. 15;

DETAILED DESCRIPTION OF THE PREFERRED EMBODIMENTS

An SRAM memory cell according to a first embodiment of the present invention will be described below with reference to FIGS. 6 through 13A~13E.

Figure 1:
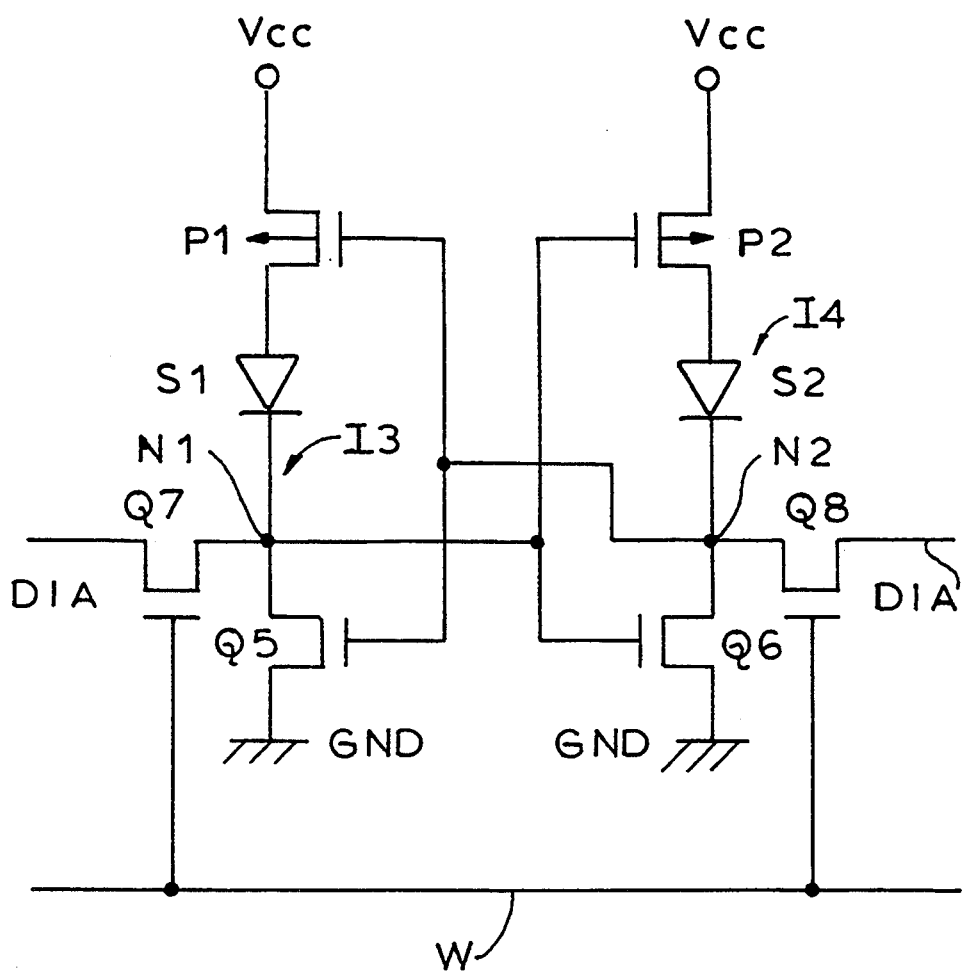
FIG. 1 is a circuit diagram of a conventional SRAM memory cell.
Figure 2:
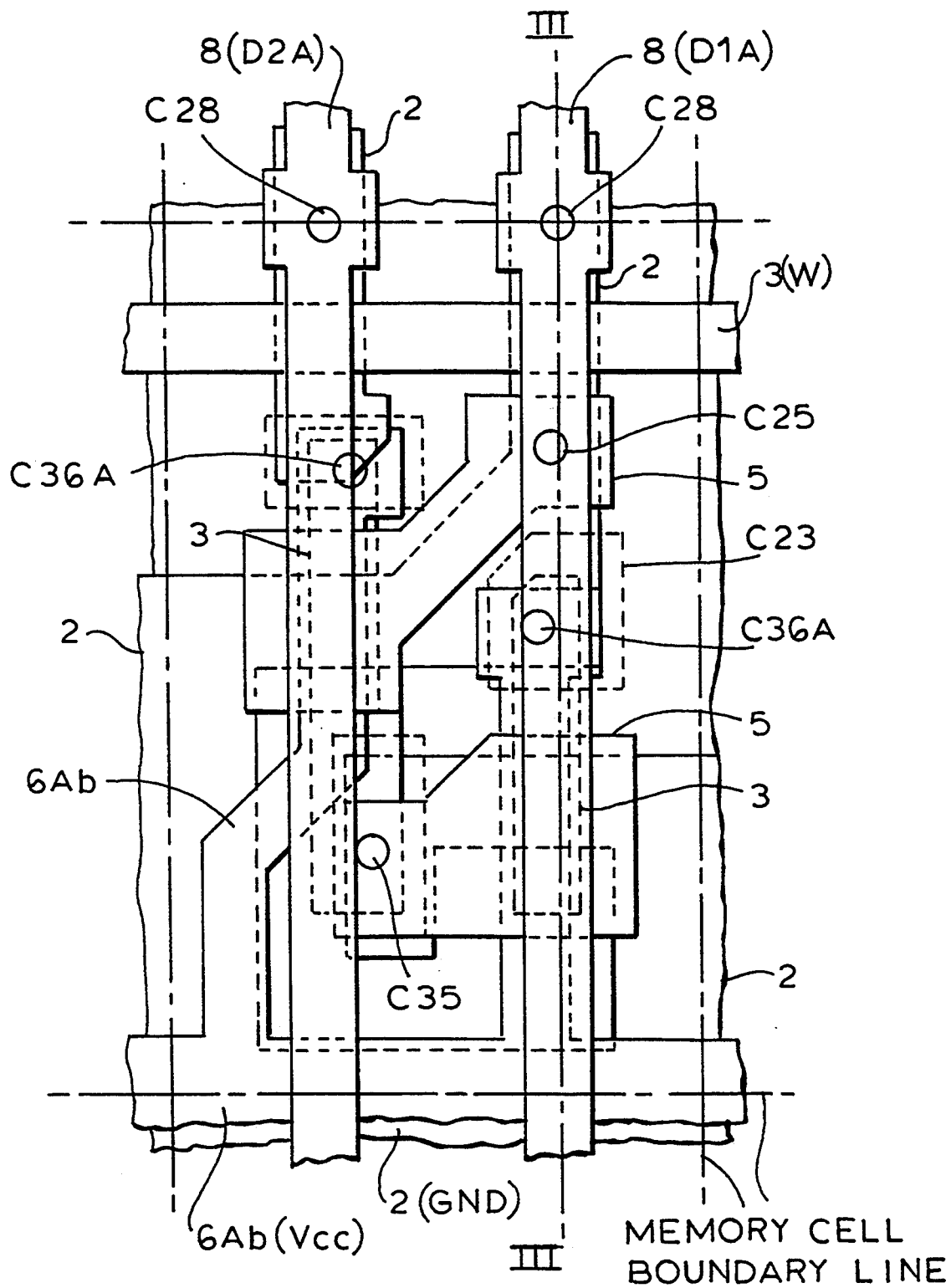
FIG. 2 is a plan view of the SRAM memory cell shown in FIG. 1.
Figure 3:
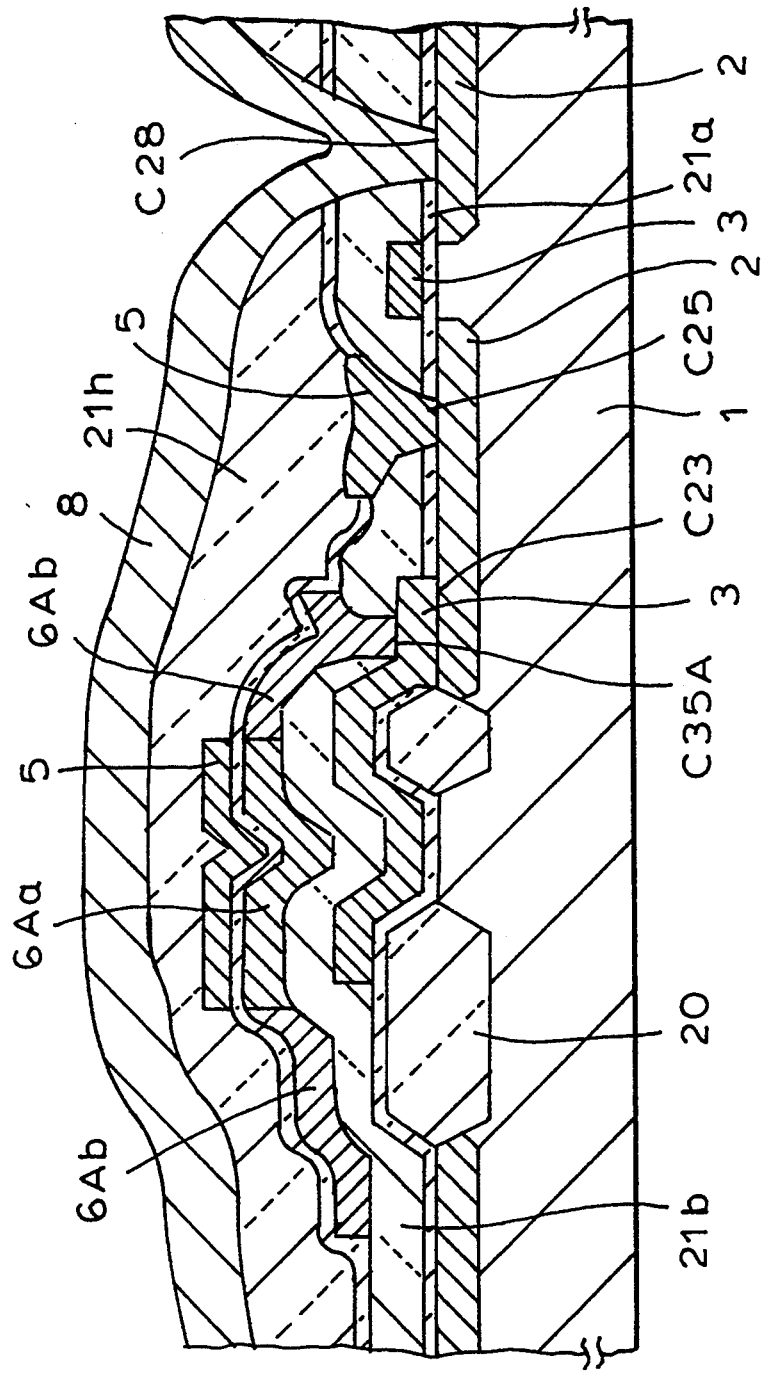
FIG. 3 is a cross-sectional view taken along line III—III of FIG. 2.
Figure 4:
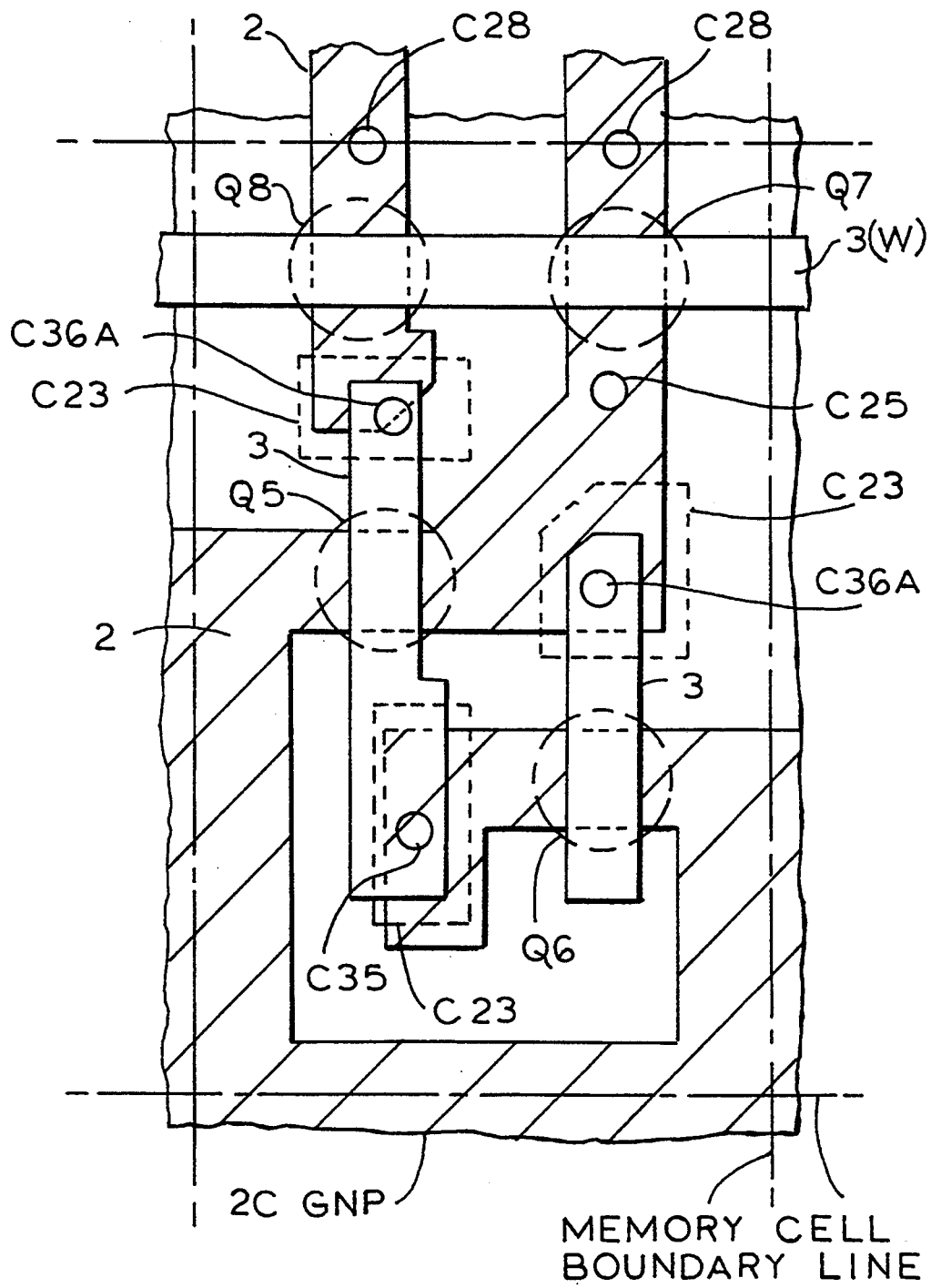
FIG. 4 is a plan view of the SRAM memory cell showing a portion of FIG. 2.
Figure 5:
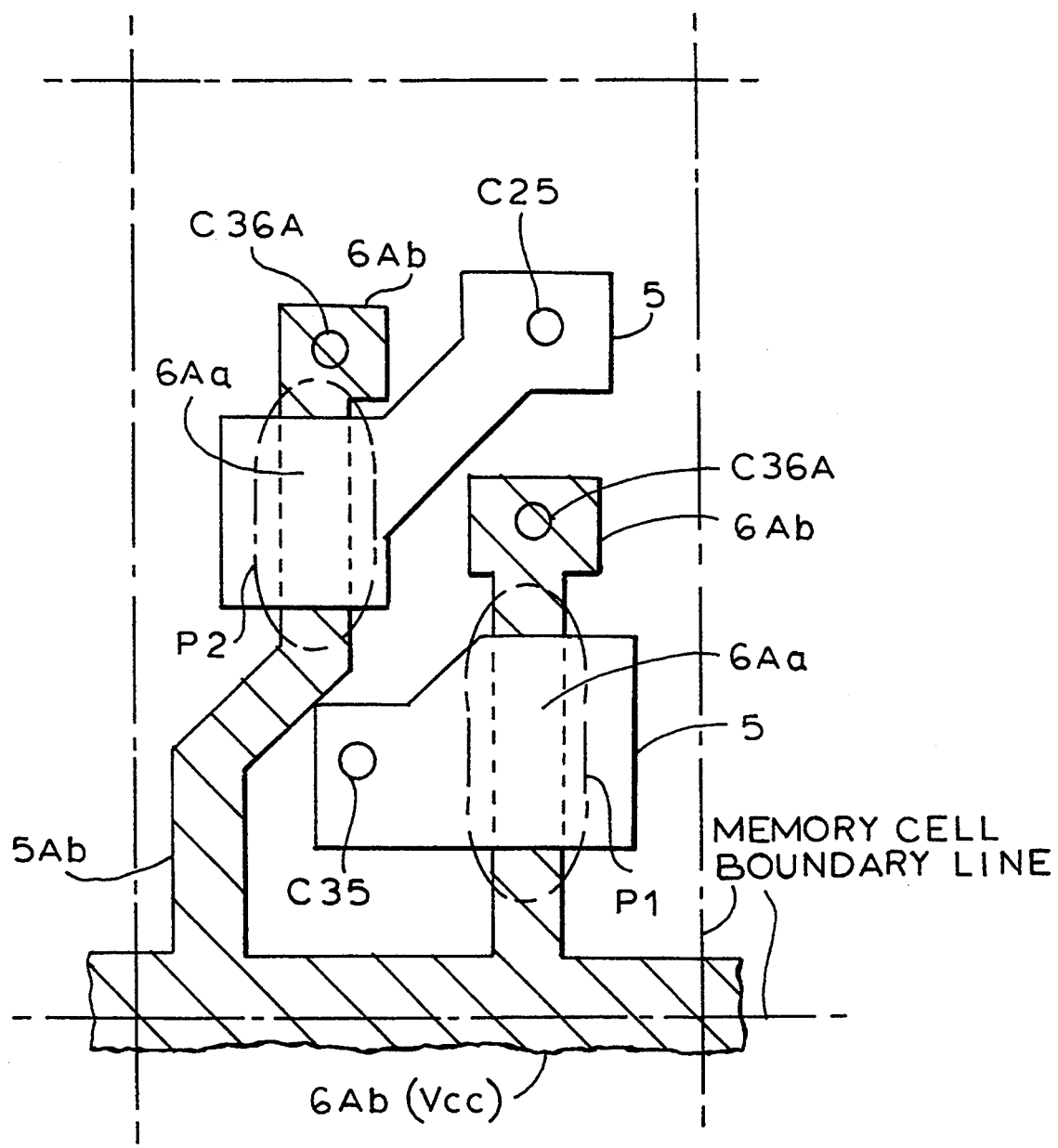
FIG. 5 is a plan view of the SRAM memory cell showing a portiong of FIG. 2.
Figure 6:
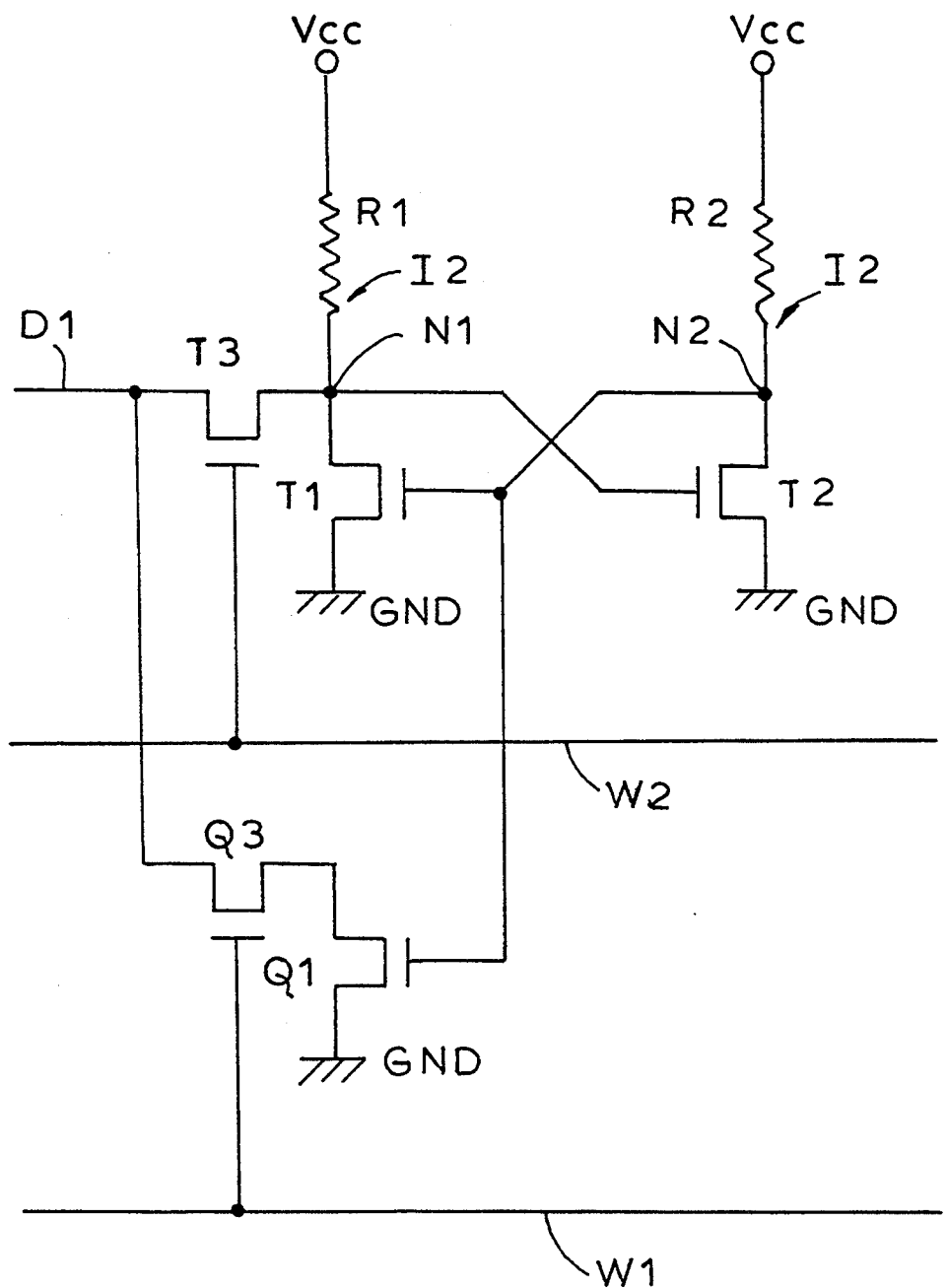
FIG. 6 is a circuit diagram of an SRAM memory cell according to a first embodiment of the present invention.
Figure 7:
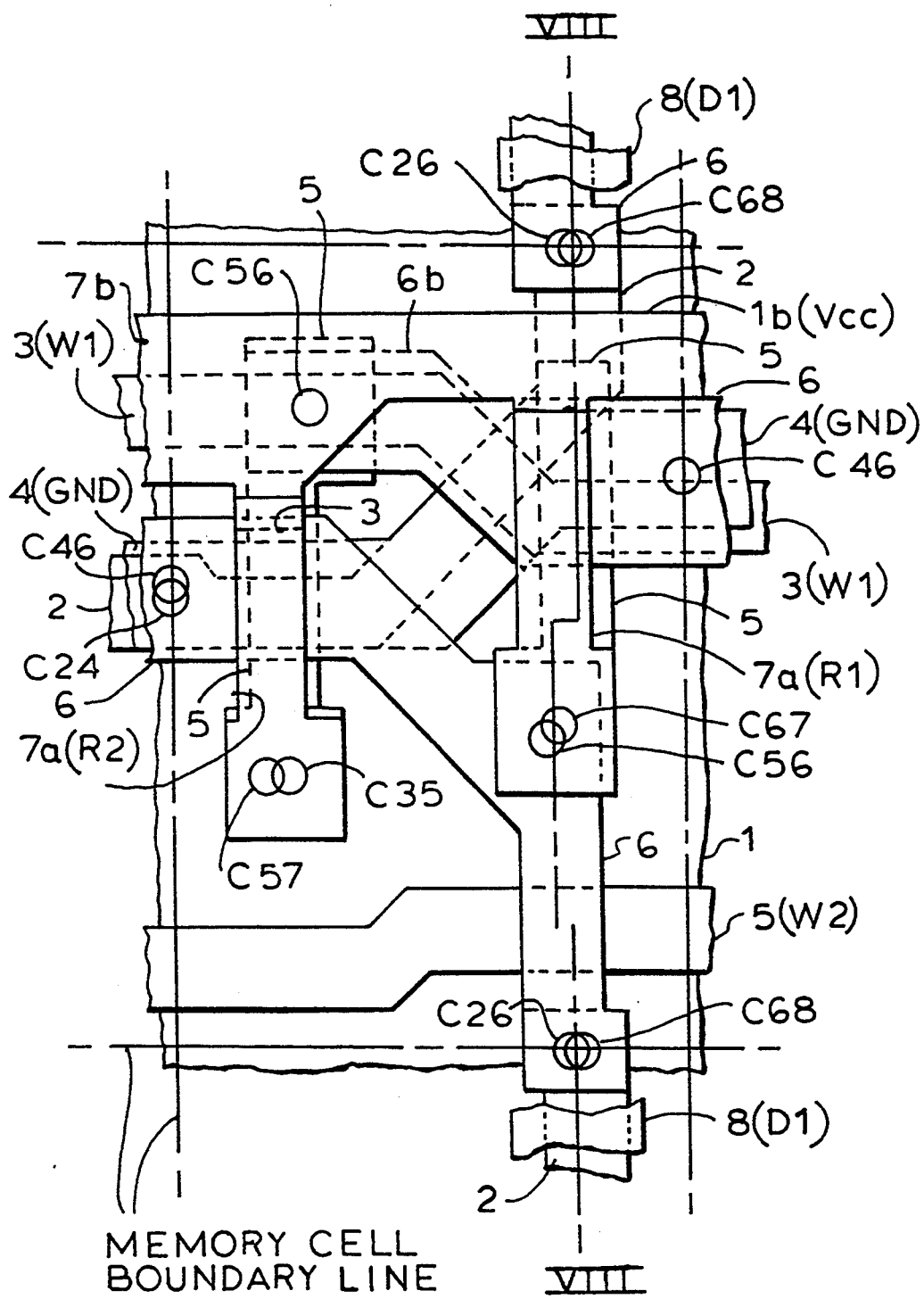
FIG. 7 is a plan view of the SRAM memory cell according to the first embodiment.

As shown in FIG. 6, the SRAM memory cell according to the first embodiment comprises a flip-flop having a first inverter I1 composed of a first MISFET T1 and a first load element R1 and a second inverter I2 composed of a second MISFET T2 and a second load element R2, the first and second inverters I1, I2 having respective input terminals connected to the output terminals of the second and first inverters I2, I1, a third MISFET T3 having a source and a drain, one of which is connected to the output terminal of the first inverter I1, a fourth MISFET Q1 having a gate connected to the output terminal of the second inverter I2, a fifth MIS- FET Q3 having a drain and a source connected to the other of the source and drain of the third MISFET T3 and the drain of the fourth MISFET Q1, respectively, a ground line GND serving as fixed potential supply means for supplying a fixed potential to the source of the fourth MISFET Q1, a read selecting signal line W1 connected to the gate of the fifth MISFET Q3, a write selecting signal line W2 connected to the gate of the third MISFET T3, and a first write,read signal line D1 connected to the other of the source and drain of the third MISFET T3. Each of the first MISFET T1, the second MISFET T2, and the third MISFET T3 is a TFT.

The device structure of the SRAM memory cell according to the first embodiment will be described below with respect to its fabrication process.

Figure 8:
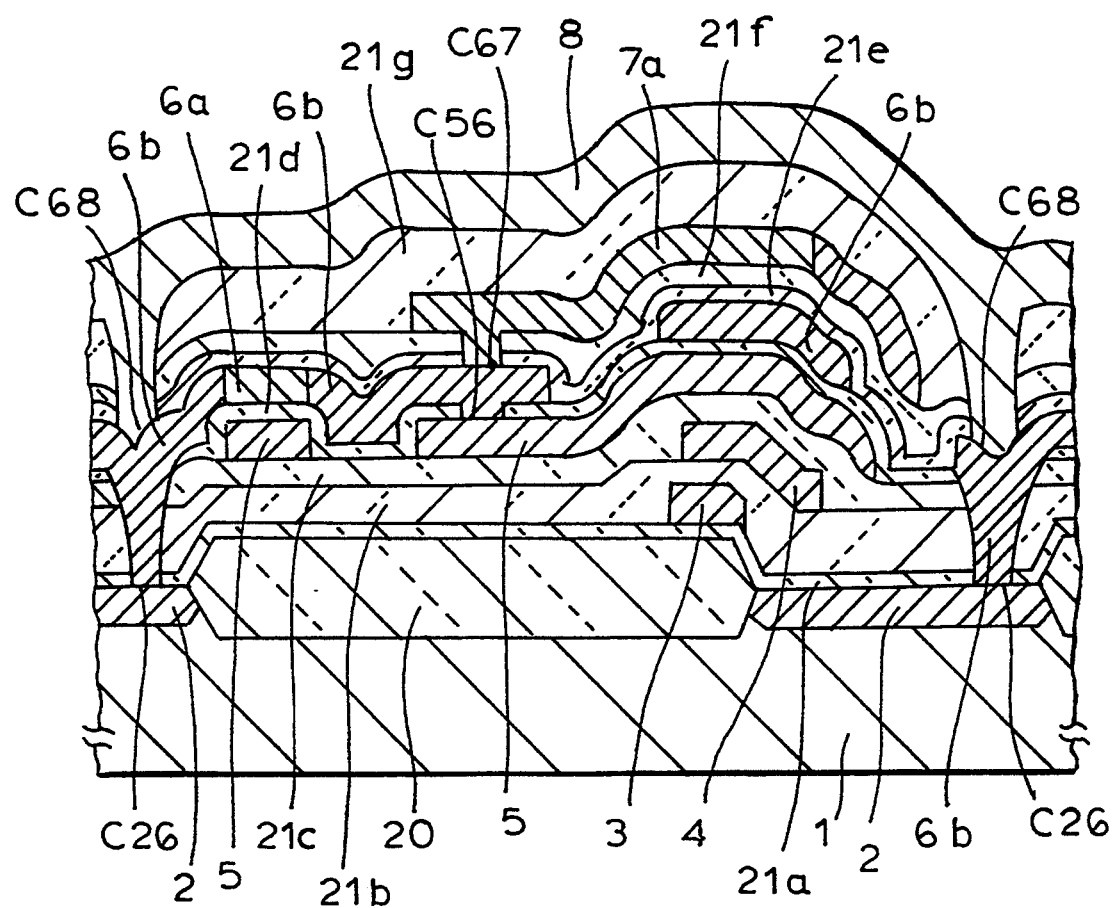
FIG. 8 is a cross-sectional view taken along line VIII—VIII of FIG. 7.
Figure 9:
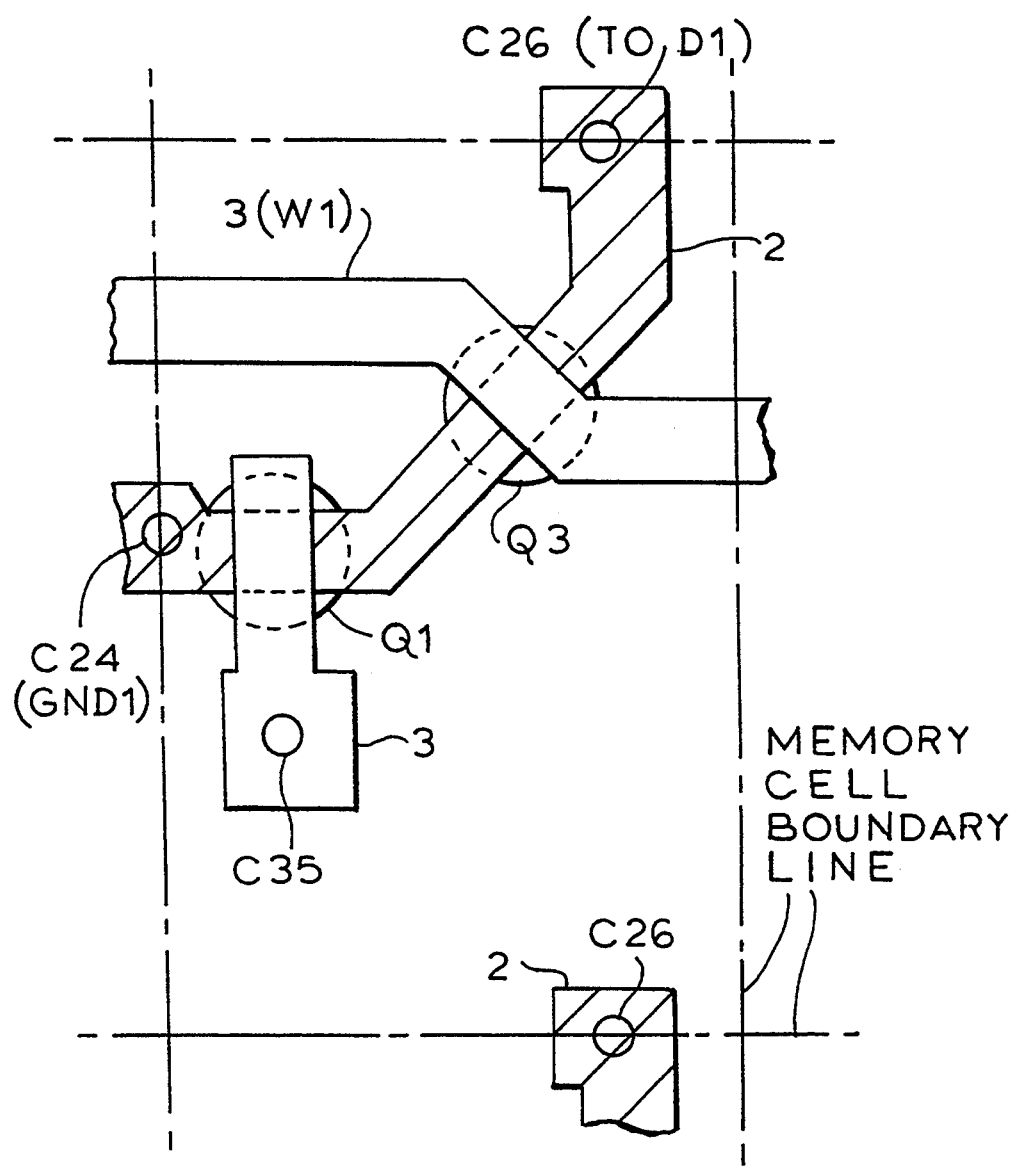
FIG. 9 is a plan view of the SRAM memory cell showing a portion of FIG. 7.
Figure 13A:
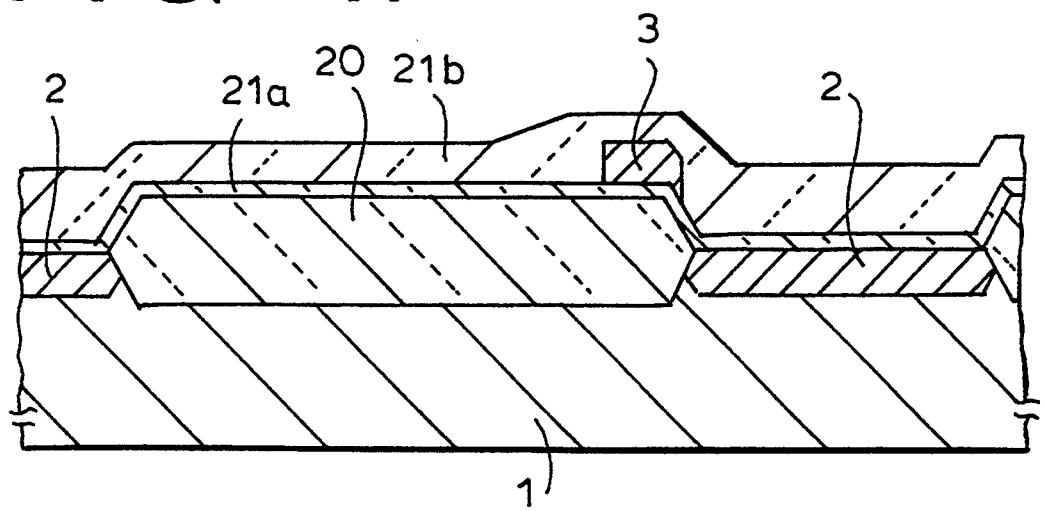
FIGS. 13A through 13E are fragmentary cross-sectional views showing successive steps of a process of fabricating the SRAM memory cell according to the first embodiment.
Figure 13B:
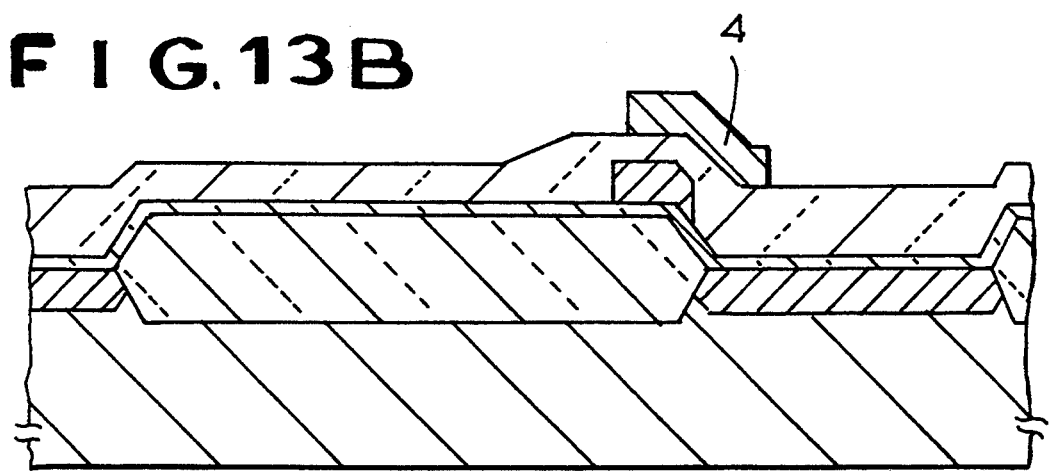

First, as shown in FIGS. 9 and 13A, an element-separating silicon oxide film 20 having a thickness ranging from 100 nm to 1000 nm is selectively formed on the surface of a P-type silicon substrate 1 (or a P well on the surface of a silicon substrate), thus defining an active region. The P-type impurity in the P-type silicon substrate 1 (or the P well) has a concentration ranging from $10^{15}$ to $10^{19}/cm^3$. In order to increase the element-separating capability, a channel stopper having an impurity concentration higher than the substrate or the well may be provided directly below the silicon oxide film 20. Then, a gate oxide film 21a having a thickness ranging from 5 nm to 30 nm is formed on the surface of at least the active region by way of thermal oxidization or the like. Thereafter, a conductive film such as polycrystalline silicon film doped with phosphorus is deposited to a thickness ranging from 30 nm to 500 nm, and then patterned, thereby forming a gate 3. Then, using the gate 3 and the silicon oxide film 20 as a mask, phosphorus or arsenic ions are implanted and thermally treated in an nitrogen atmosphere at 800° C. to 1000° C. for several seconds to several hours, thereby providing N-type impurity-diffused regions 2. In this manner, the fourth MISFET Q1 and the fifth MISFET Q3 are formed. As shown in FIG. 9, the gate of the fifth MISFET Q3 doubles as the read selecting signal line W1. Then, an inter-layer insulating film 21b such as a silicon oxide film is deposited to a thickness ranging from 10 nm to 300 nm by CVD or the like. Thereafter, a connection hole C24 (see FIGS. 7, 8, and 9) is formed which reaches the impurity-diffused region 2 of the source of the fourth MISFET Q1. As shown in FIGS. 12 and 13B, a conductive film 4 such as a tungsten silicide film is formed and patterned to the ground line GND.

Figure 10:
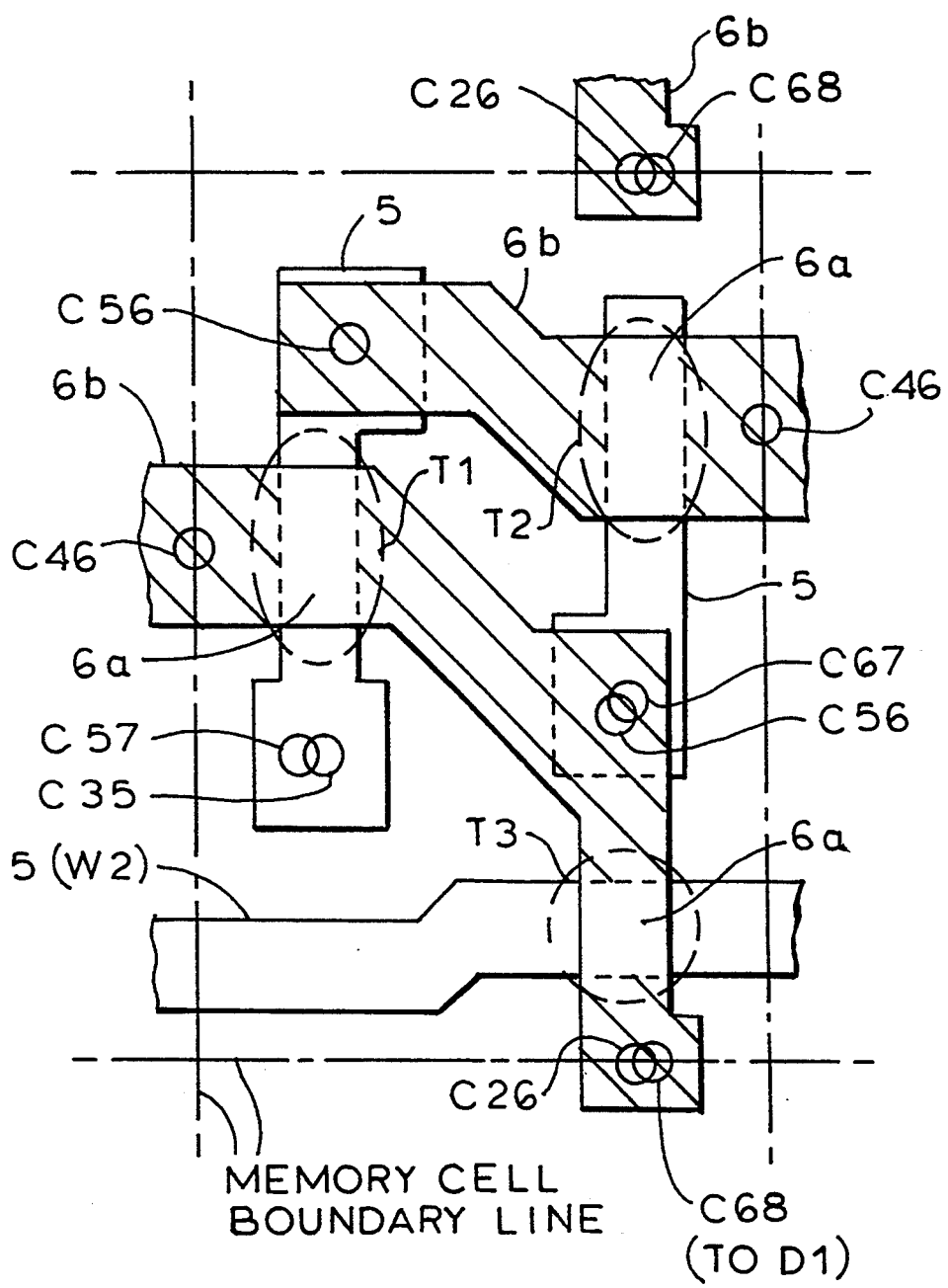
FIG. 10 is a plan view of the SRAM memory cell showing a portion of FIG. 7.
Figure 13C:
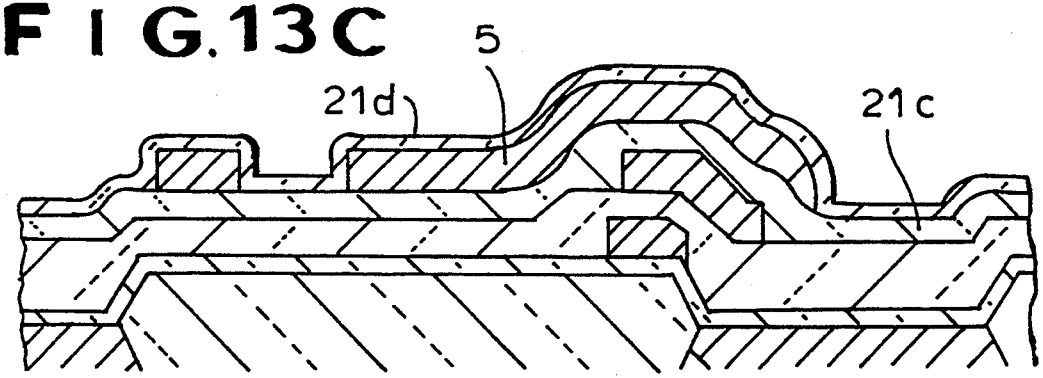

Then, as shown in FIG. 13C, an inter-layer insulating film 21c such as a silicon oxide film is deposited to a thickness ranging from 10 nm to 300 nm. After a connection hole C35 which reaches the gate 3 shown in FIG. 9 is defined, a conductive film such as a polysilicon film or the like which is doped with phosphorus is deposited to a thickness ranging from 50 nm to 500 nm, and then patterned to form the gates 5 of the TFTs T1, T2, T3 as shown in FIG. 10. The gate 5 of the TFT T3 doubles as the write selecting signal line W2. Thereafter, a silicon oxide film 21d having a thickness ranging from 5 nm to 50 nm is deposited as gate insulating films of the TFTs T1, T2, T3 by CVD or the like.

Figure 11:
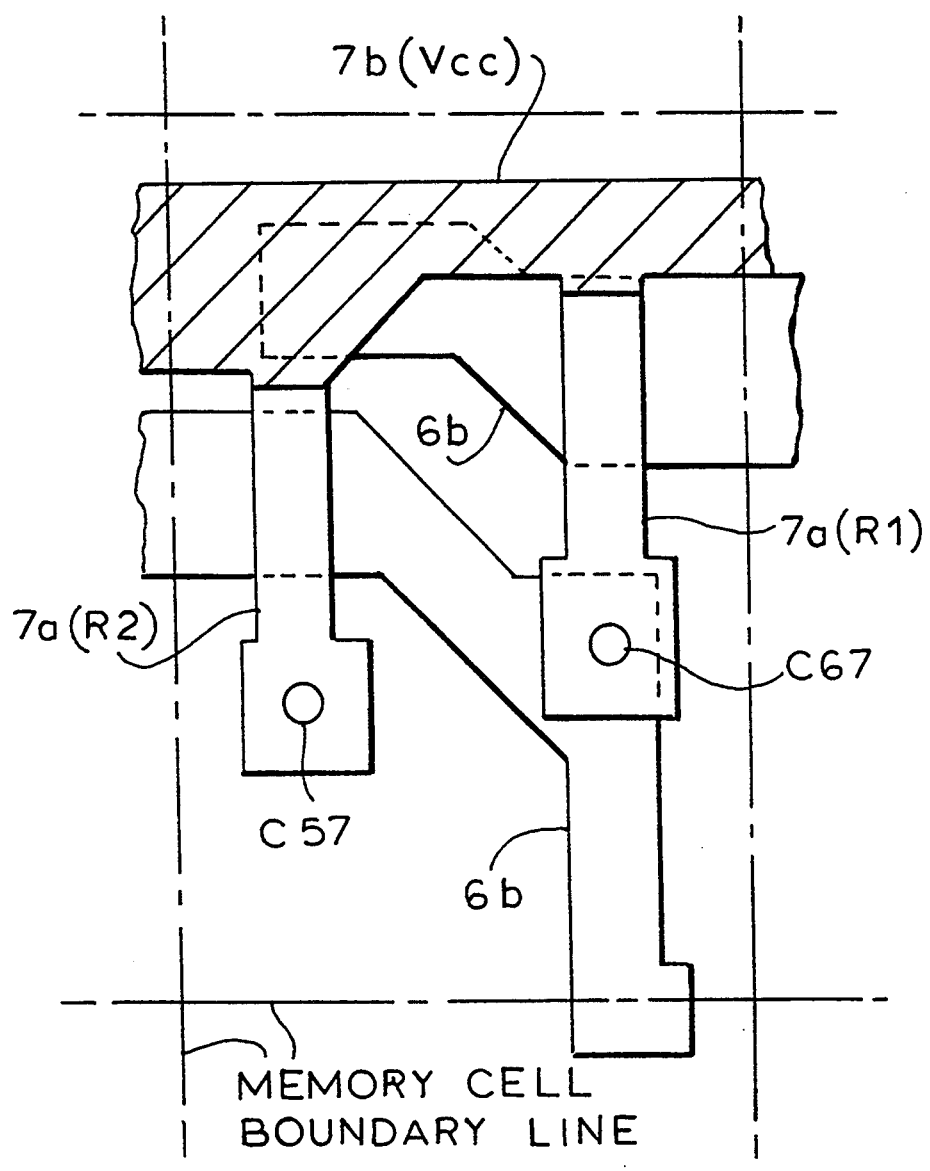
FIG. 11 is a plan view of the SRAM memory cell showing a portiong of FIG. 7.
Figure 13D:
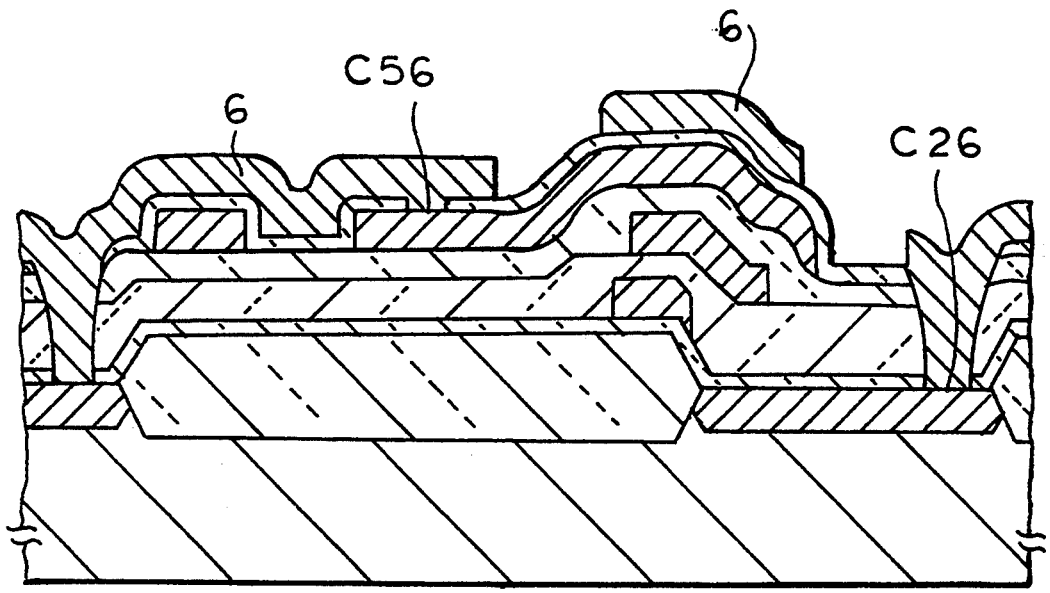
Figure 13E:
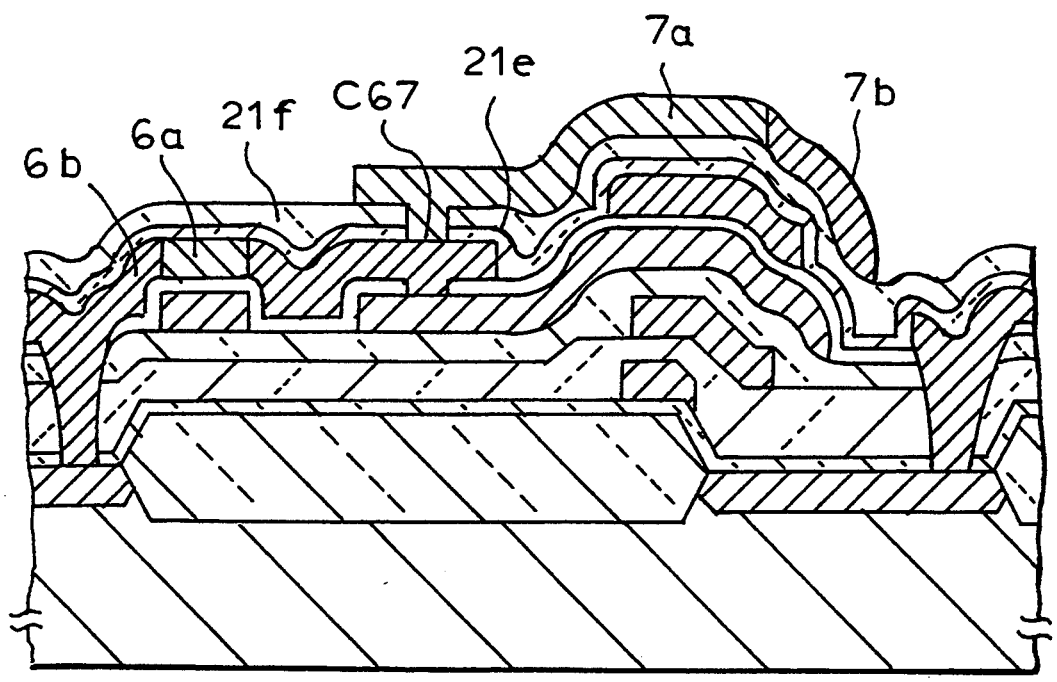
Figure 15:
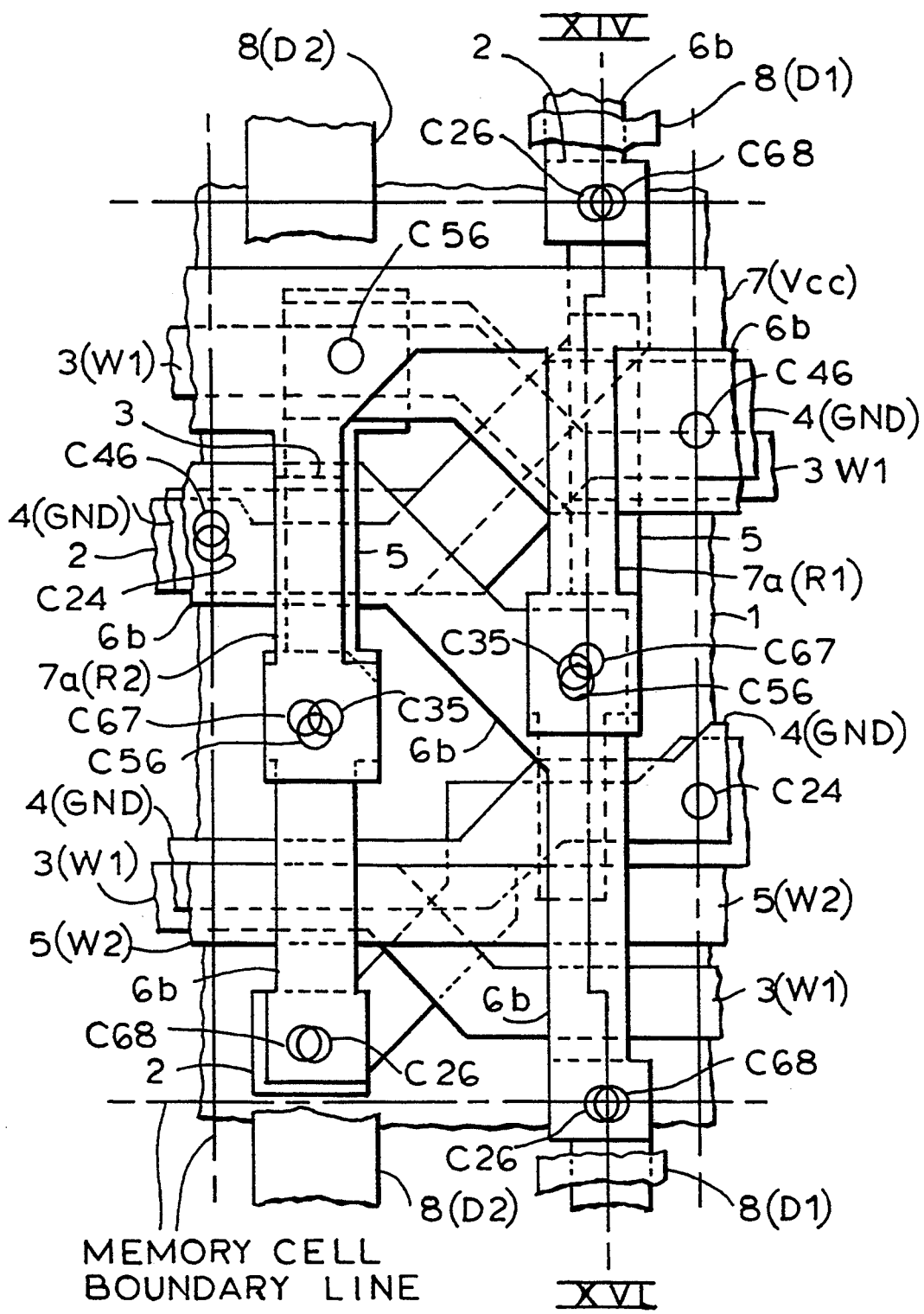
FIG. 15 is a plan view of the SRAM memory cell according to the second embodiment.
Figure 16:
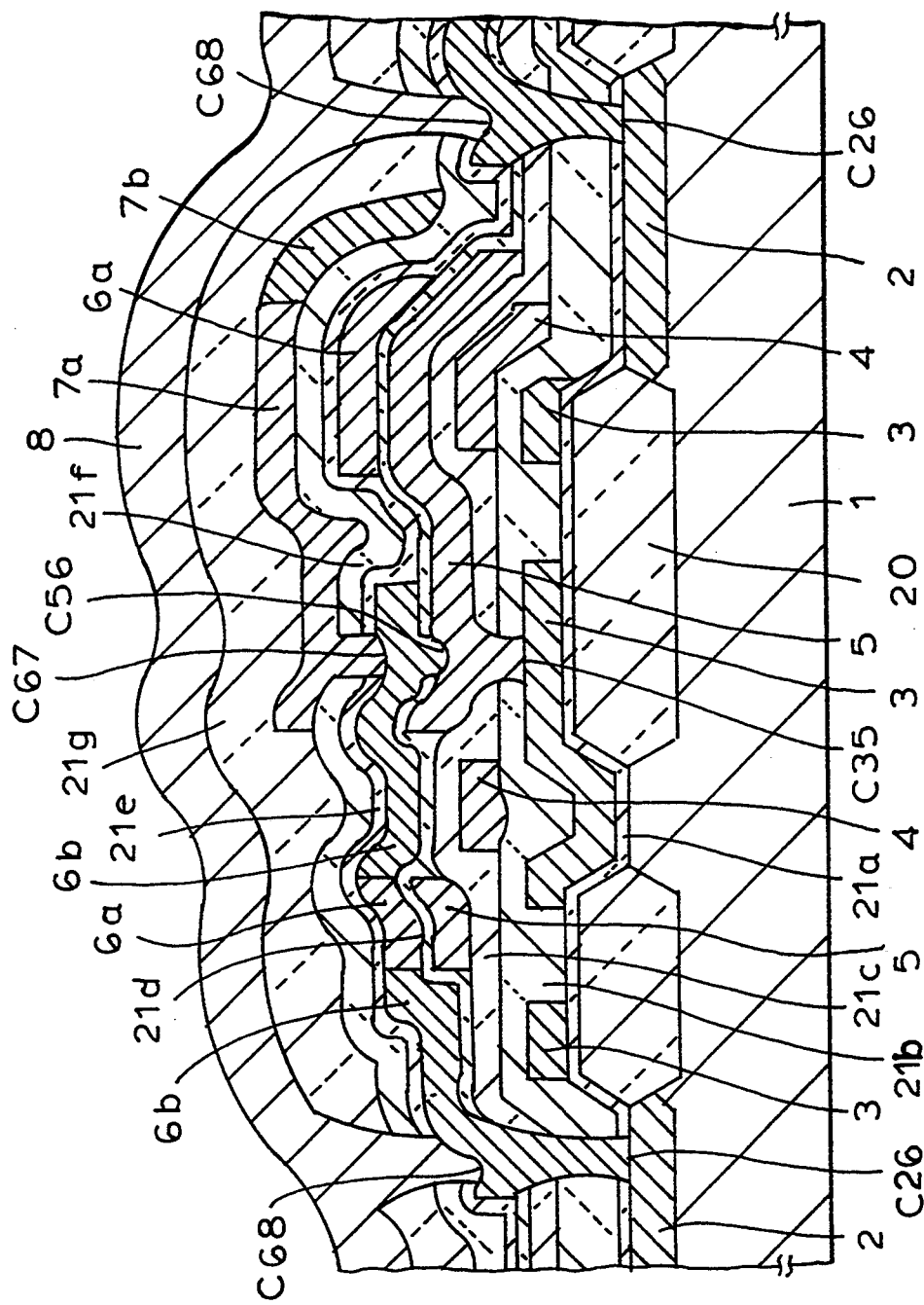
FIG. 16 is a cross-sectional view taken along line XVI—XVI of FIG. 15.

Then, connection holes C26 which reach one of the source and drain of the MISFET Q3, connection holes C46 for connecting the sources of the TFTs T1, T2 to the ground line GND, and connection holes C56 which reach the gates 5 of the TFTs T1, T2 are defined. As shown in FIG. 13D, a silicon film 6 is deposited to a thickness in the range of 30 nm to 300 nm, and a P-type impurity as of boron is introduced at a concentration in the range of $10^{10}$ to $10^{14}/cm^2$ by ion implantation. Then, as shown in FIG. 13E, a silicon oxide film 21e having a thickness ranging from 3 nm to 30 nm is formed by thermal oxidization or CVD, and thereafter regions crossing the gates 5 of the TFTs T1, T2, T3 (which will be the channels 6a of the TFTs) are covered with a photoresist film by photolithography, and an N-type impurity as of phosphorus ions is injected at a concentration in the range of $10^{14}$ to $10^{17}/cm^2$ by ion implantation in order to form the source and drains 6b of the TFTs. Subsequently, the photoresist film is removed, and an inter-layer insulating film 21f such as a silicon oxide film is deposited to a thickness ranging from 10 nm to 300 nm. After a connection hole C57 which reaches the gate 5 of the TFT T1 and connection holes C67 which reach the sources and drains 6b of the TFTs T1, T3 are defined as shown in FIGS. 10 and 11, a silicon film having a high electric resistance which is made of polycrystalline silicon with a minute quantity of an impurity added is deposited to a thickness ranging from 30 nm to 500 nm. As shown in FIG. 11, an impurity as of phosphorus is selectively injected by photolithography to form thereby a power supply line 7b (Vcc) and load resistors 7a (R1), 7a(R2).

As shown in FIG. 8, an insulating film 21g such as a silicon oxide film is deposited to a thickness ranging from 10 nm to 300 nm. Then, as shown in FIG. 12, connection holes C68 reaching one of the source and drain of the TFT T3 are defined, and the aluminum line 8 is formed.

Operation of the SRAM memory cell according to the first embodiment will be described below with reference to FIG. 6. The first and second MISFETs T1, T2 are drive N-channel TFTs, and the resistors R1, R2 are load elements for the TFTs T1, T2. The first inverter I1 composed of the TFT T1 and the resistor R1 and the second inverter I2 composed of the TFT T2 and the resistor R2 are coupled in a cross connection, providing a flip-flop which has storage nodes N1, N2 for storing complementary potential levels of "H" or "L". When the storage node N1 is in an "H" state and the storage node N2 is in an "L" state, the drive N-channel intrasubstrate MISFET (the fourth MISFET Q1) is turned off. When the storage node N1 is in an "L" state and the storage node N2 is in an "H" state, the fourth MISFET Q1 is turned on.

While the load elements for the flip-flop comprise resistors in order to simplify the LSI fabrication process in the above embodiment, P-channel TFTs may be employed as load elements if the flip-flop is required to operate more stably.

If no information is to be read or written, both the first word line (read selecting signal line W1) and the second word line (write selecting signal line W2) are kept at the ground potential to turn off the transfer N-channel intrasubstrate MISFET (the fifth MISFET Q3) and the transfer N-channel TFT (the third MISFET T3).

Stored information can be read by increasing the potential at the first word line W1 to the power supply potential and thereafter reading an electric signal appearing on the write/read signal line D1. When the storage node N1 is in the "H" stage and the storage node N2 is in the "L" state, the signal read on the signal line D1 is of "high impedance". When the storage node N1 is in the "L" state and the storage node N2 is in the "H" state, the signal read on the signal line D1 is in the "L" state.

Information can be written by increasing the potential at the second word line W2 to the power supply potential and thereafter shifting the level of the signal line D1 forcibly to the power supply potential or the ground potential. If the power supply potential is given to the signal line D1, then the storage node N1 is brought to the "H" state and the storage node N2 is brought to the "L" state. If the ground potential is given to the signal line D1, then the storage node N1 is brought to the "L" state and the storage node N2 is brought to the "H" state.

In this embodiment, information is read from and written in the memory cell through different paths as described above. The reasons for using such different paths in reading and writing information are as follows. In the first embodiment, it would be possible to read information from the signal line D1 by increasing the second word line W2 to the power supply potential as when writing information. However, since the drive transistors of the flip-flop are TFTs whose current drive capability is lower than the intrasubstrate MISFETs, the stored information would tend to be destroyed and high-speed operation would not be performed if the information were read through the above path. According to the above embodiment, the N-channel intrasubstrate MISFET Q1 which is turned on and off depending on the "H" or "L" state of the storage node N2 is provided, and the state of the MISFET Q1 is read through the transfer transistor Q3. With such an arrangement, the memory cell is rendered resistant to alpha rays with the two storage nodes containing no impurity-diffused regions in the substrate, and the stored information can be read at high speed.

Comparison of the memory cell according to the first embodiment and the conventional memory cell, as described above, which has the same cell area as the inventive memory cell indicates that the number of occurrences of soft errors per unit alpha ray dose of the memory cell according to the first embodiment, as measured for alpha ray resistance using americium-252 or the like, is about one-tenth of the conventional memory cell.

In the first embodiment, the TFTs T1, T2, T3 may be replaced with SOI transistors.

While the films serving as the gates of the TFTs T1, T2, T3 are formed below the films serving as the channels thereof, the films serving as the gates may be formed above the films serving as the channels, or the TFTs T1, T2, T3 may include those which have gates disposed below the channels and those which have gates disposed above the channels, for the purpose of reducing the area of the memory cell.

An SRAM memory cell according to a second embodiment of the present invention will be described below with reference to FIGS. 14 through 19.

Figure 18:
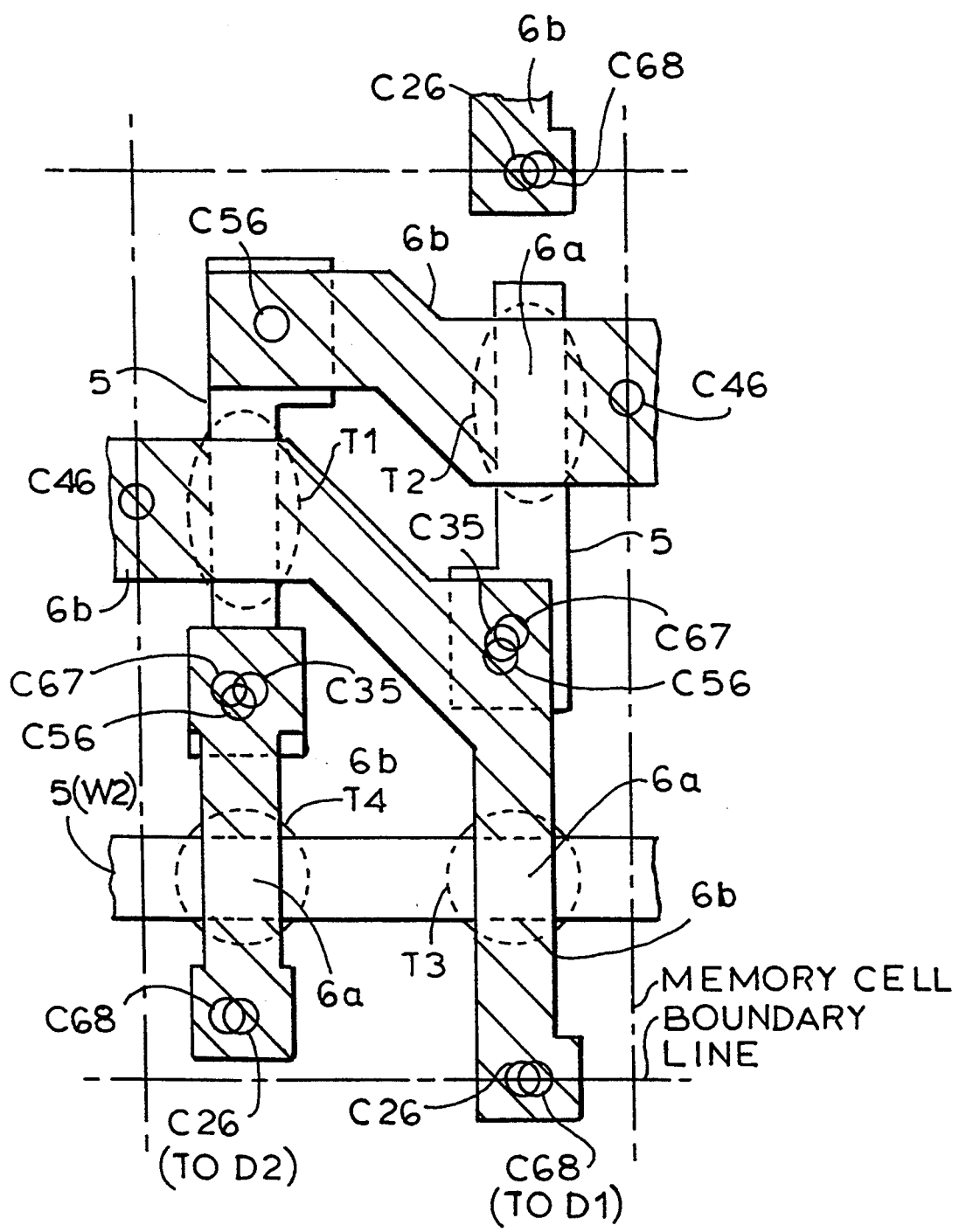
FIG. 18 is a plan view of the SRAM memory cell showing a portion of FIG. 15.
Figure 19:
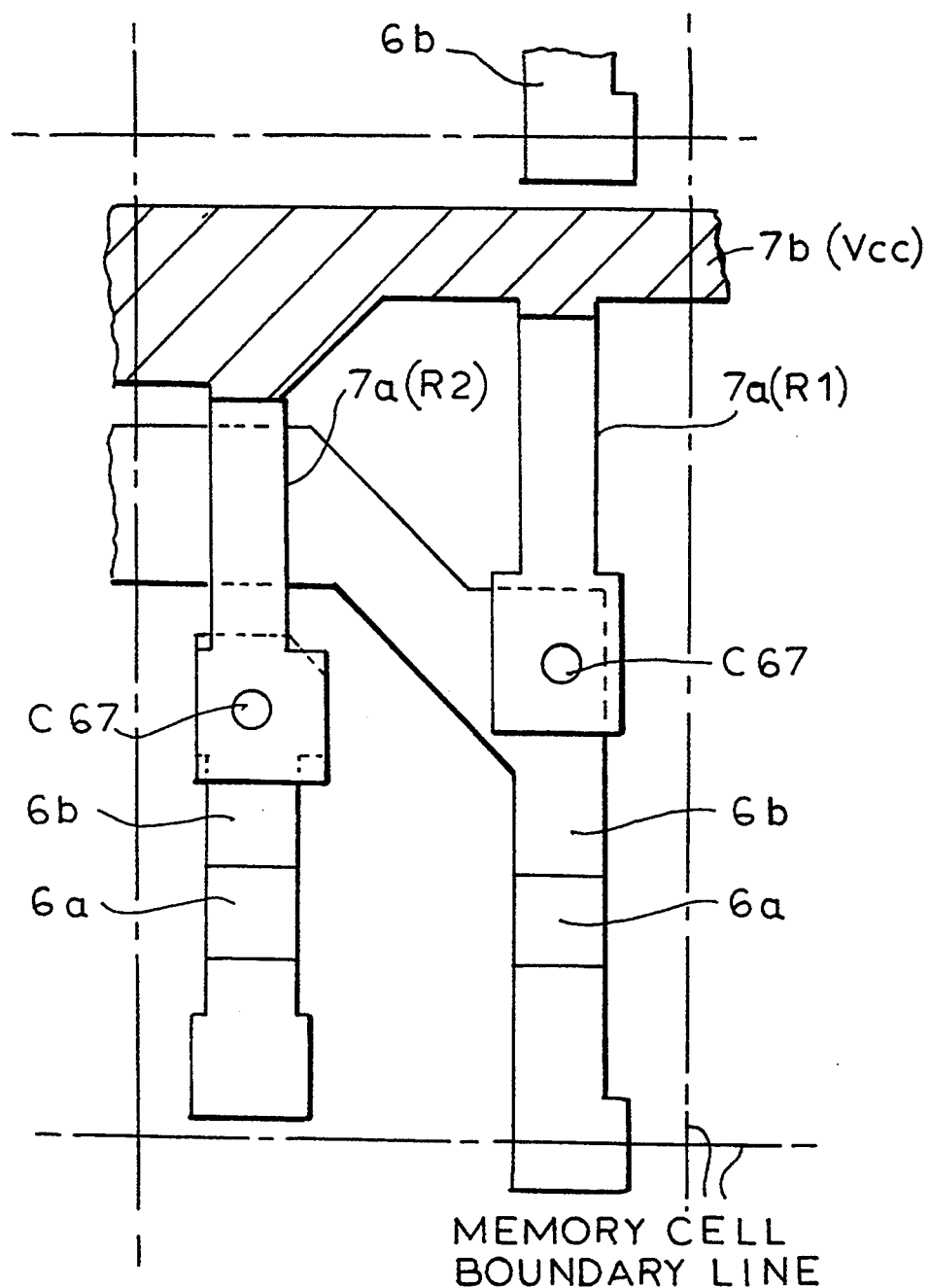
FIG. 19 is a plan view of the SRAM memory cell showing a portion of FIG. 15.
Figure 20:
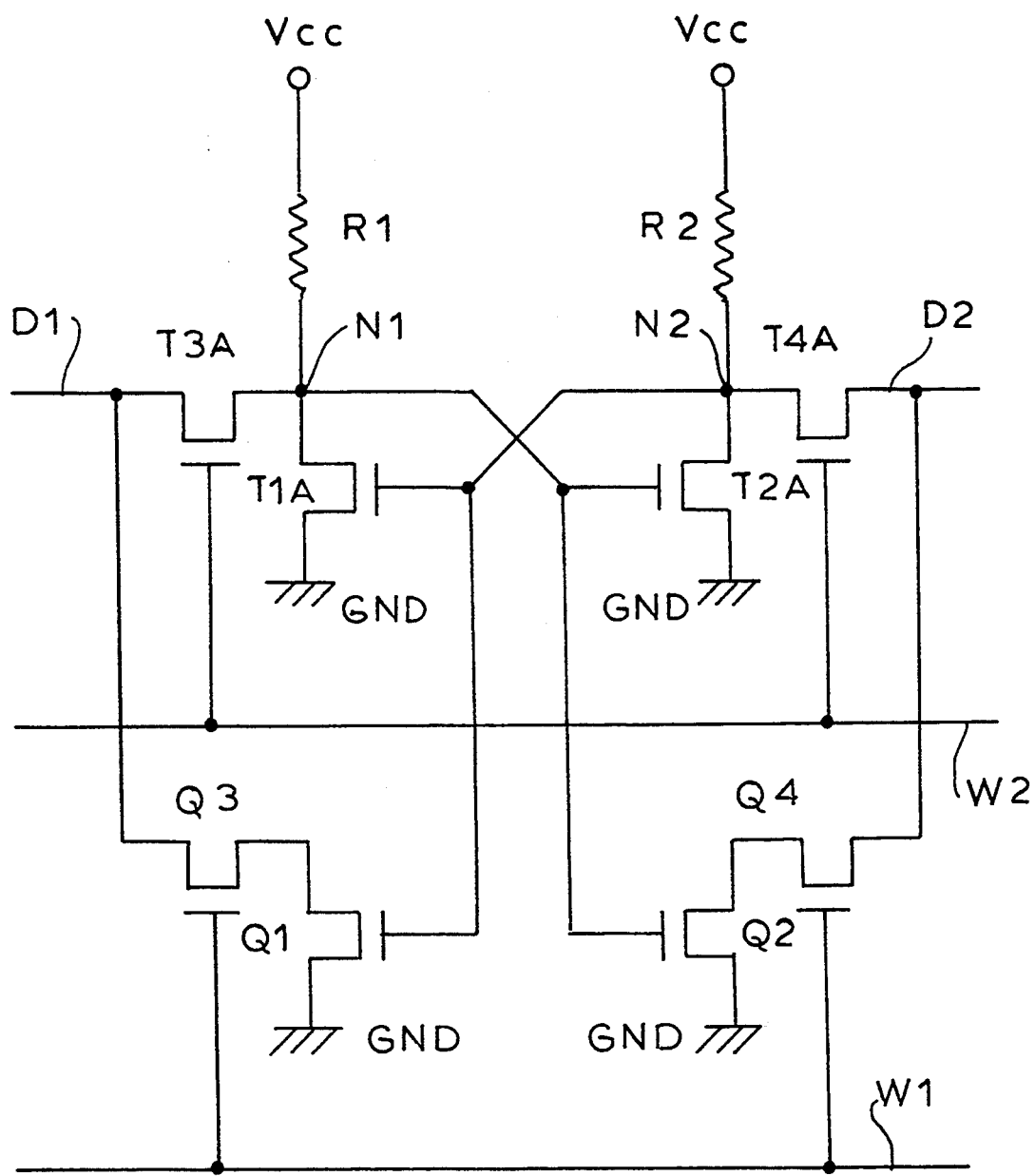
FIG. 20 is a circuit diagram of an SRAM memory cell according to a third embodiment of the present invention.
Figure 21:
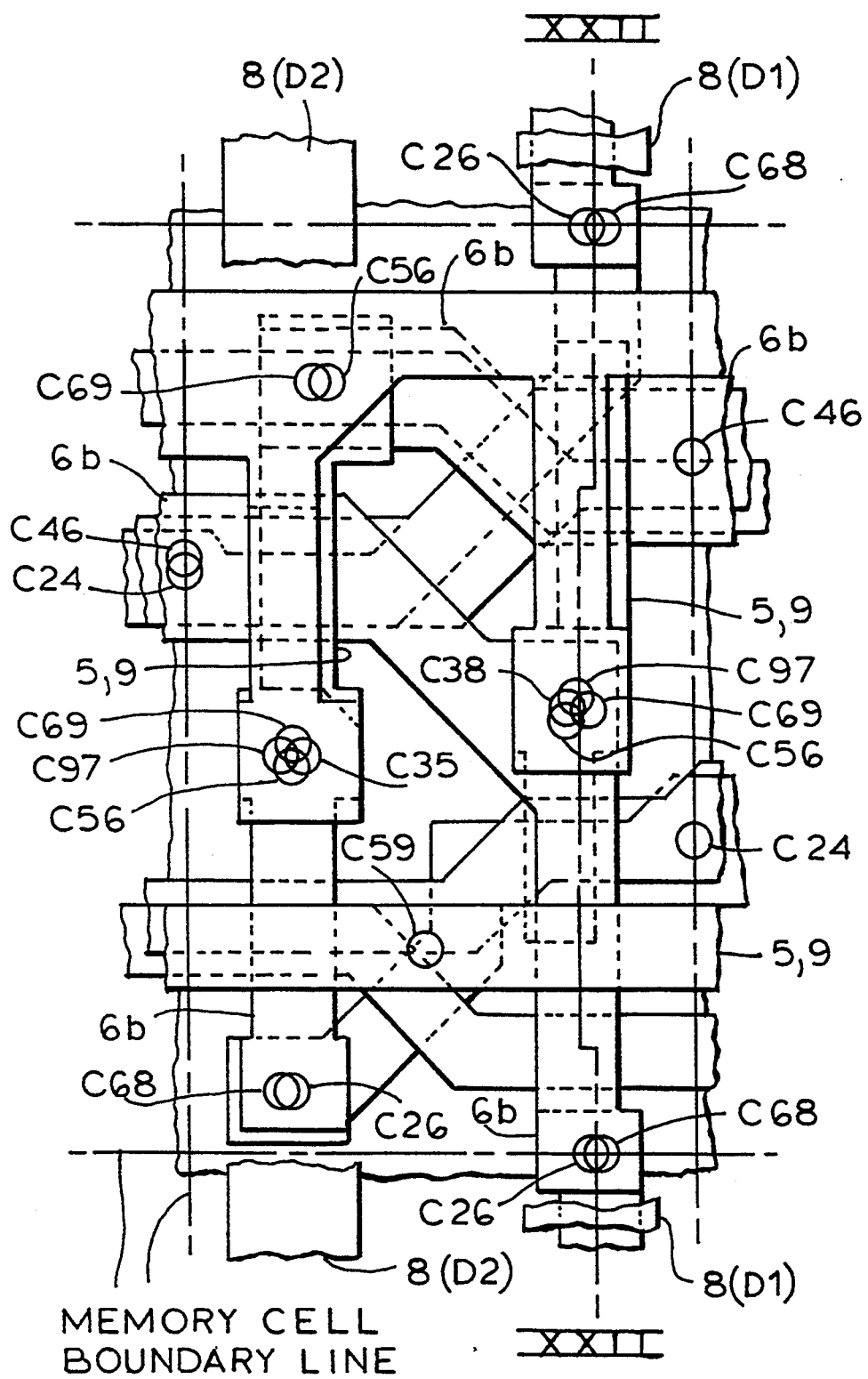
FIG. 21 is a plan view of the SRAM memory cell according to the second embodiment.
Figure 22:
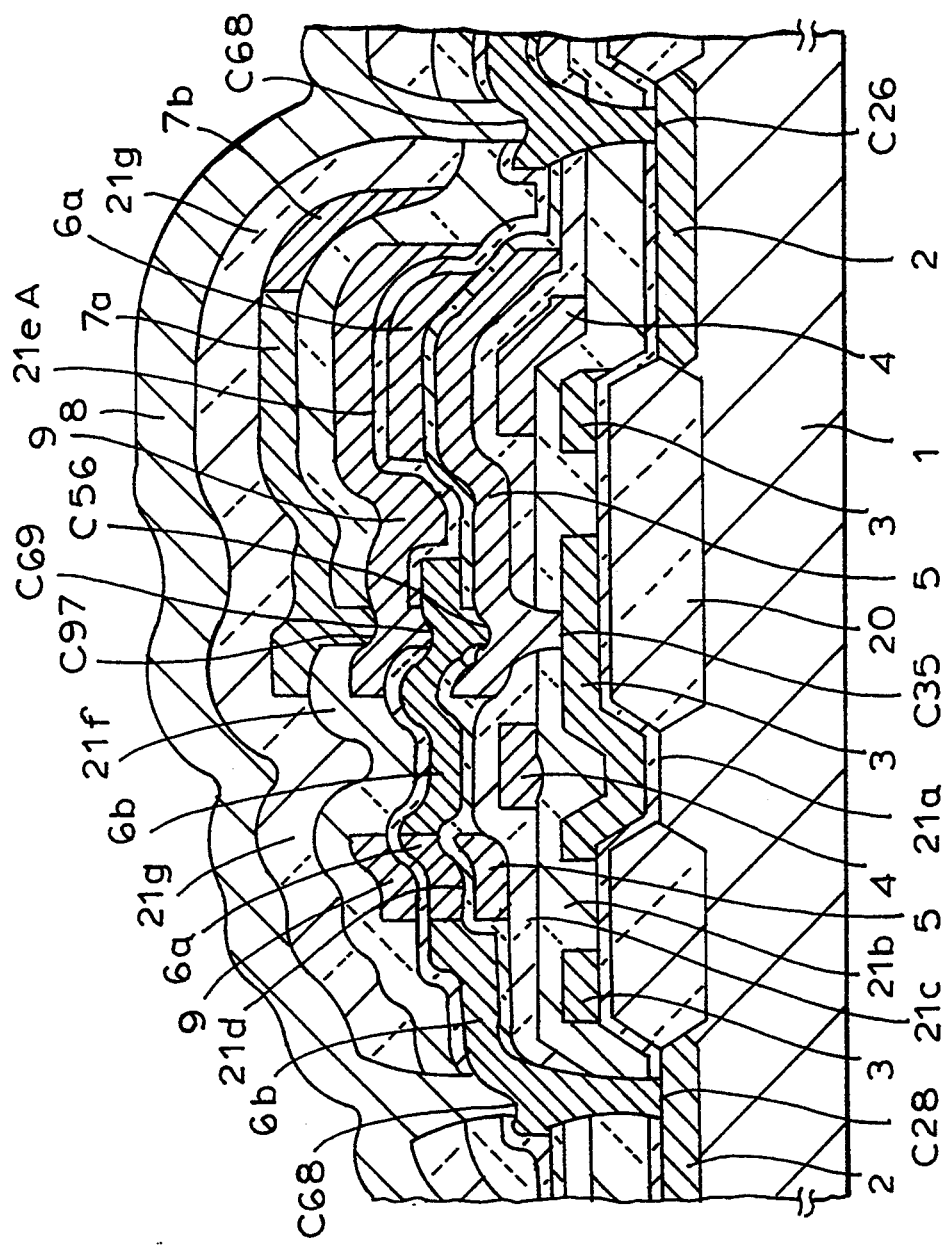
FIG. 22 is a cross-sectional view taken along line XXII—XXII of FIG. 21.
Figure 23:
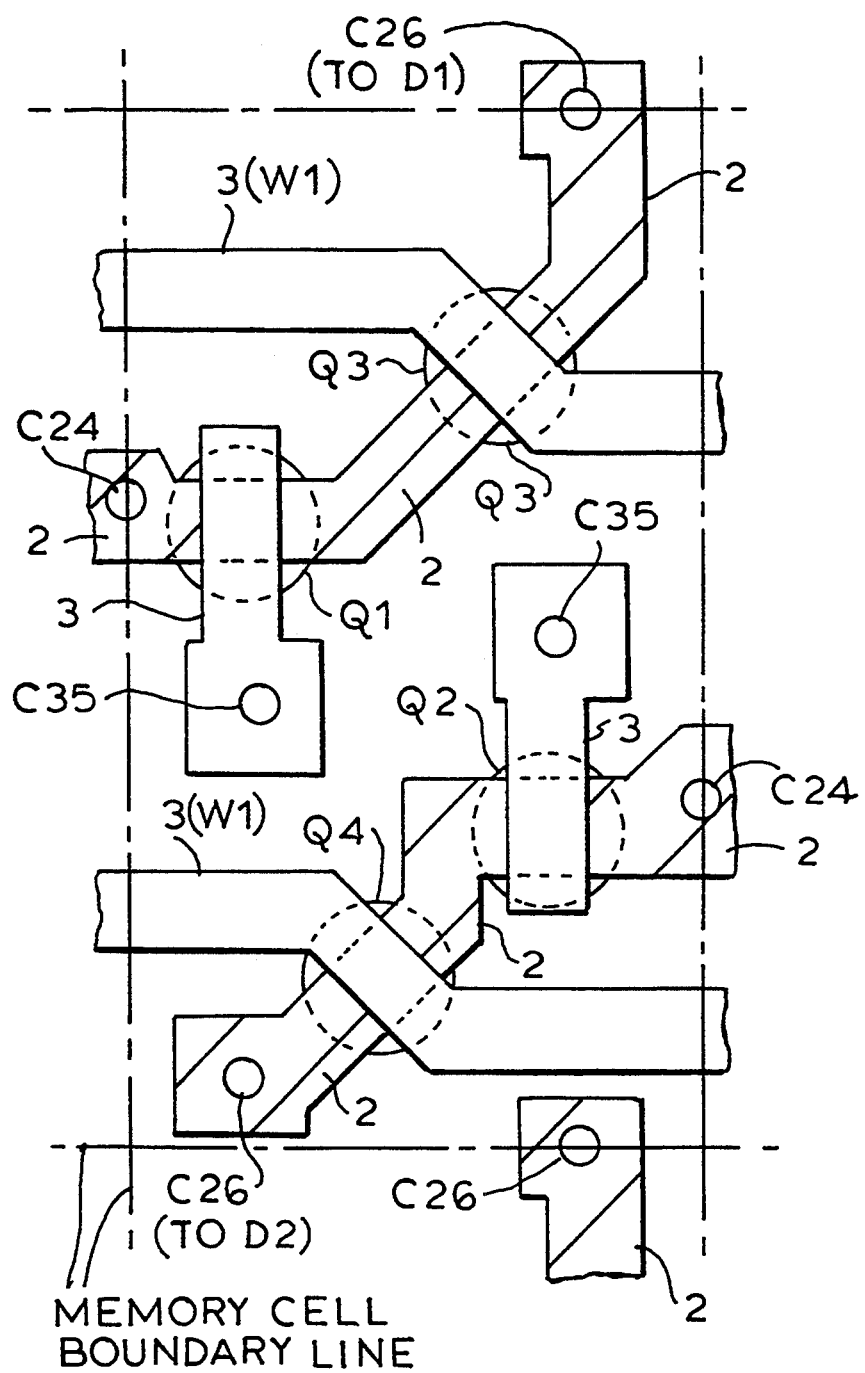
FIG. 23 is a plan view of the SRAM memory cell showning a portion of FIG. 21.
Figure 24:
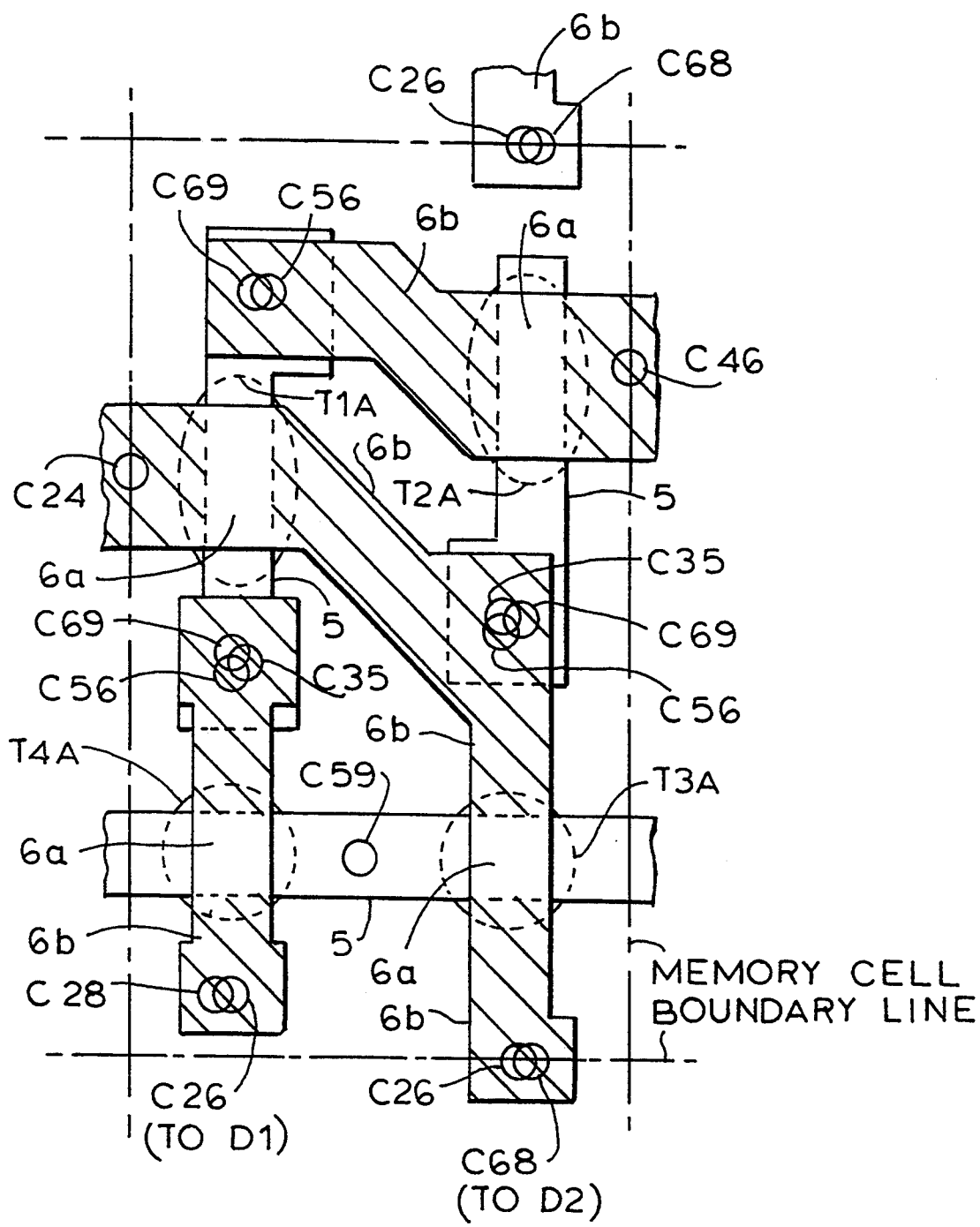
FIG. 24 is a plan view of the SRAM memory cell showing a portion of FIG. 21.
Figure 25:
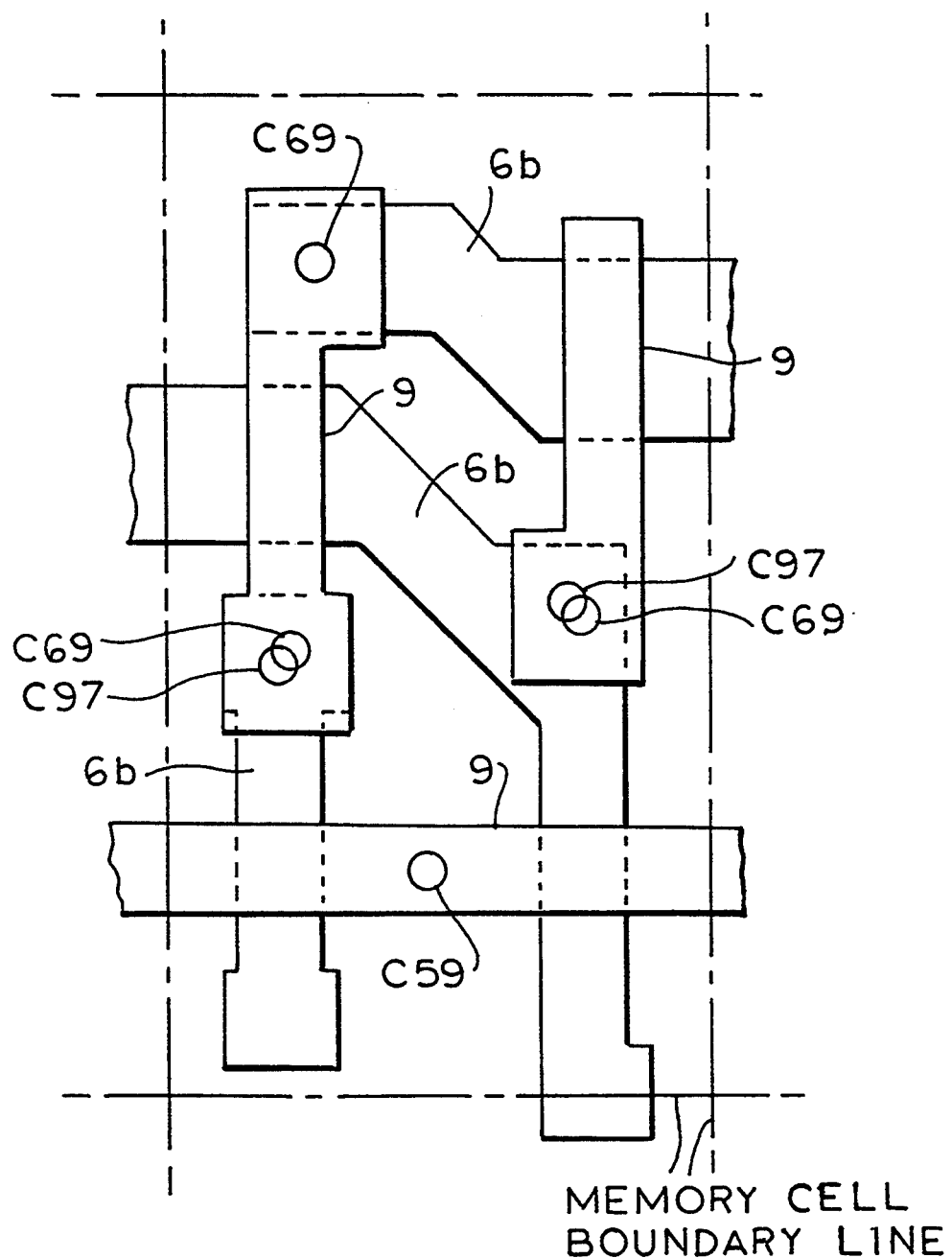
FIG. 25 is a plan view of the SRAM memory cell showing a portion of FIG. 21.
Figure 26:
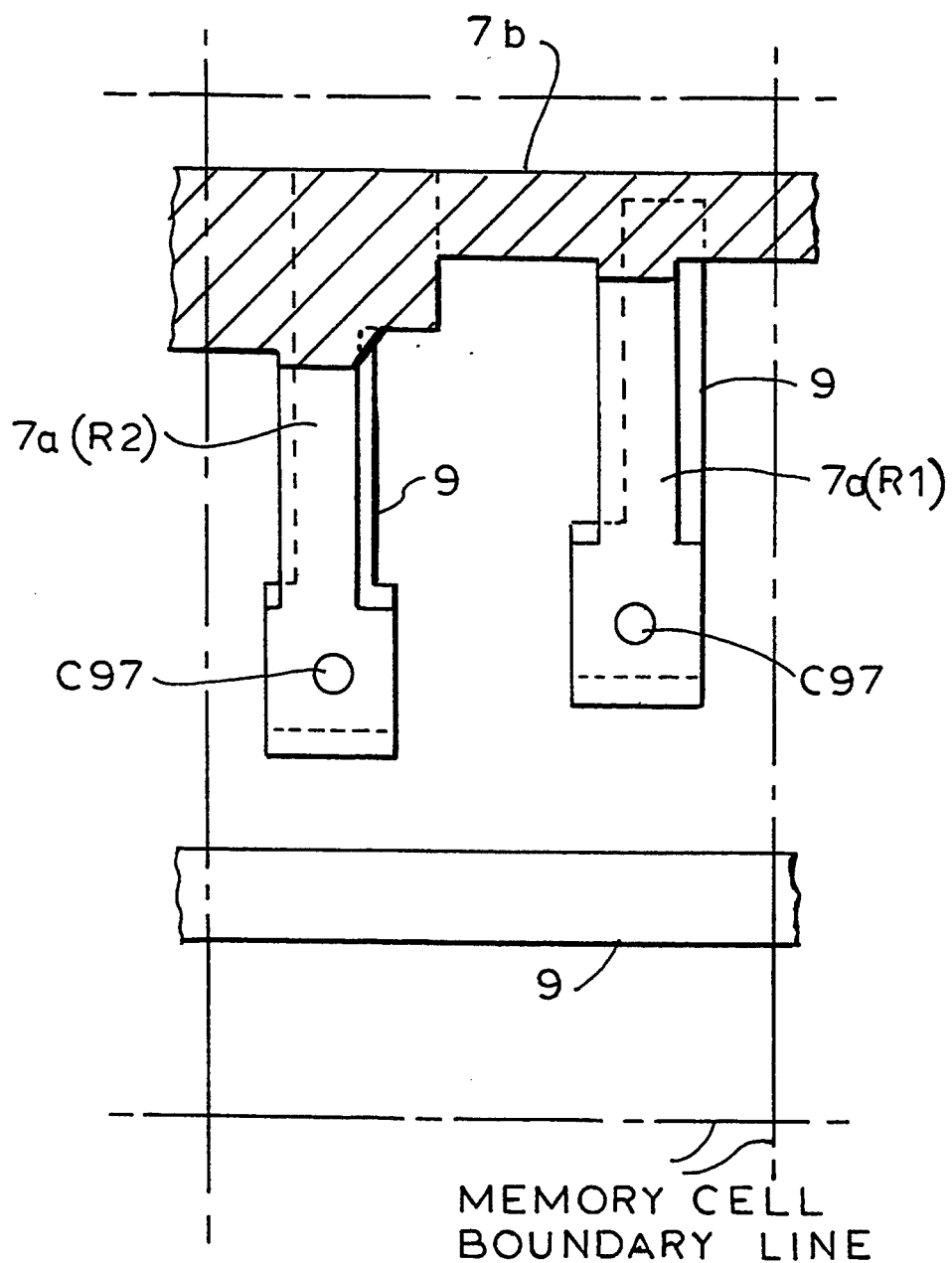
FIG. 26 is a plan view of the SRAM memory cell showing a portion of FIG. 21.
Figure 27:
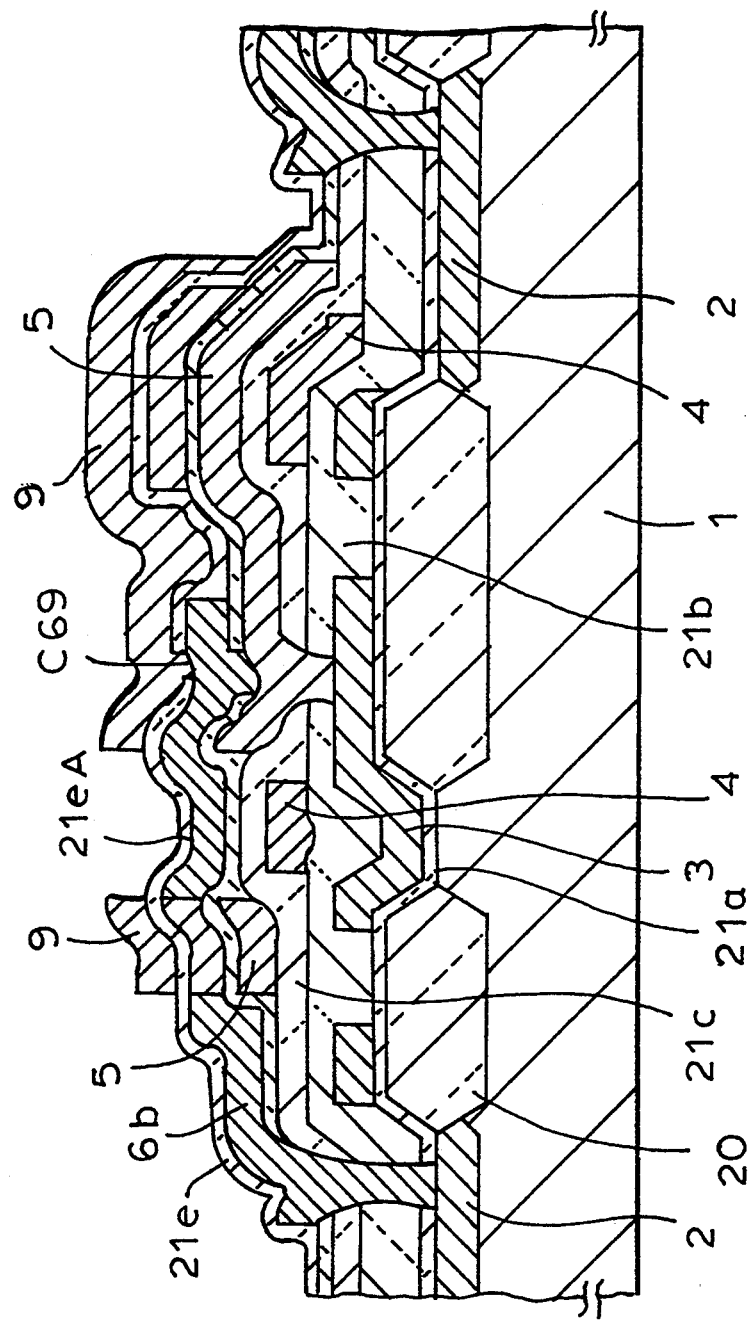
FIG. 27 is a cross-sectional view illustrative of a process of fabricating the SRAM memory cell according to the third embodiment.

The SRAM memory cell according to the second embodiment differs from the SRAM memory cell according to the first embodiment in that it additionally includes a sixth MISFET T4 having a source and a drain, one of which is connected to the output terminal N2 of the second inverter I2, and a gate connected to the write selecting signal line W2, a second write/read signal line D2 connected to the other of the source and drain of the sixth MISFET T4, a seventh MISFET Q2 having a gate and a source connected to the output terminal N1 of the first inverter I1 and the ground line, respectively, and an eighth MISFET Q4 having a source and a drain, one of which is connected to the drain of the MISFET Q2 and the other connected to the second write/read signal line D2, and a gate connected to the read selecting signal line W1. As shown in FIG. 18, the MISFET T4 is an N-channel TFT as with the MISFET T3, and as shown in FIG. 17, the MISFETs Q2, Q4 are N-channel intrasubstrate MISFETs as with the MISFETs Q1, Q3. It is assumed that the two read selecting signal lines 3 (W1) shown in FIG. 17 are short-circuited in set quantities of bits at suitable locations (not shown).

Operation of the SRAM memory cell according to the second embodiment will be described below. The TFTs T1, T2 and the resistors R1, R2 constitute a flip-flop as with the first embodiment, and provide storage nodes N1, N2 for storing complementary potential levels of "H" or "L". When the storage node N1 is in an "H" state and the storage node N2 is in an "L" state, the drive N-channel intrasubstrate MISFET Q1 is turned off, and the MISFET Q2 is turned on. When the storage node N1 is in an "L" state and the storage node N2 is in an "H" state, the MISFET Q1 is turned on and the MISFET Q2 is turned off. While the load elements for the flip-flop comprise resistors in order to simplify the LSI fabrication process in the second embodiment, P-channel TFTs may be employed as load elements if the flip-flop is required to operate stably.

If no information is to be read or written, both the first word line W1 and the second word line W2 are kept at the ground potential to turn off the transfer N-channel intrasubstrate MISFETs Q3, Q4 and the transfer N-channel TFTs T3, T4.

Stored information can be read by increasing the potential at the first word line W1 to the power supply potential and thereafter reading complementary electric signals appearing on the write/read signal lines D1, D2. When the storage node N1 is in the "H" state and the storage node N2 is in the "L" state, the signals read on the signal lines D1, D2 are of "high impedance" and "L", respectively. When the storage node N1 is in the "L" state and the storage node N2 is in the "H" state, the signals read on the signal lines D1, D2 are of "L" and "high impedance", respectively.

Information can be written by increasing the potential at the second word line W2 to the power supply potential and thereafter either shifting the level of the signal line D1 or D2 forcibly to the power supply potential or the ground potential or applying the complementary potentials to the signal lines D1, D2.

The SRAM memory cell according to the second embodiment can be fabricated in substantially the manner as the SRAM memory cell according to the first embodiment.

The SRAM memory cell according to the second embodiment is almost as resistant to alpha rays as the SRAM memory cell according to the first embodiment.

In the second embodiment, the TFTs T1, T2, T3 may also be replaced with SOI transistors.

In the second embodiment, while the films serving as the gates of the TFTs T1, T2, T3, T4 are formed below the films serving as the channels thereof, the films serving as the gates may be formed above the films serving as the channels, or the TFTs T1, T2, T3, T4 may include those which have gates disposed below the channels and those which have gates disposed above the channels, for the purpose of reducing the area of the memory cell.

The SRAM memory cell according to the second embodiment is characterized by the addition of the TFT T4 and the MISFETs Q2, Q4 to the SRAM memory cell according to the first embodiment. Even in the absence of the MISFETs Q2, Q4, information can be written in the SRAM memory cell according to the second embodiment in exactly the same manner as the SRAM memory cell according to the first embodiment, and the stored information can be read through the signal line D1.

An SRAM memory cell according to a third embodiment of the present invention will be described below with reference to FIGS. 20 through 27.

The SRAM memory cell according to the third embodiment differs from the SRAM memory cell according to the second embodiment in that the TFTs T1~T4 of the second embodiment are replaced with N-channel TFTs T1A~T4A, respectively, which have gates positioned above and below films that serve as their channels.

The SRAM memory cell according to the third embodiment is fabricated as follows:

As with the first and second embodiments, sources and drains 6b and channels 6a of the N-channel TFTs T1A~T4A are formed. Then, a silicon oxide film 21eA having the same thickness as the silicon oxide film 21d is formed, connection holes C59, C69 are defined, and a conductive film 9 such as a polycrystalline silicon film doped with phosphorus is deposited to a thickness ranging from 50 nm to 500 nm, and then patterned on the gates 5 (W2) to the same configuration as the gates 5. Then, an insulating film 21f is deposited, and connection holes C97 are defined. Then, a power supply line 7b and resistors 7a (R1), 7a(R2) are formed, an insulating film 21g is deposited, connection holes 68 are defined, and an aluminum line 8 is formed.

The SRAM memory cell according to the third embodiment operates in the same manner as the SRAM memory cell according to the second embodiment.

The number of occurrences of software-related errors per unit alpha ray dose of the memory cell according to the third embodiment, as measured for alpha ray resistance using americium-252 or the like, is about 20% less than for the memory cells according to the first and second embodiments. This may be because the TFTs having gates disposed above and below the channel have a greater current drive capability than the TFTs having one gate which are used in the memory cells according to the first and second embodiments, and hence the memory cell can store information with improved stability.

Although certain preferred embodiments of the present invention have been shown and described in detail, it should be understood that various changes and modifications may be made therein without departing from the scope of the appended claims.

What is claimed is:

1. A semiconductor memory cell comprising:
   a flip-flop having a first inverter composed of a first MISFET and a first load element and a second inverter composed of a second MISFET and a second load element, said first and second inverters having respective input terminals connected to the respective output terminals of the second and first inverters;
   a third MISFET having a source and a drain, one of which is connected to the output terminal of said first or second inverter;
   a fourth MISFET having a gate connected to the output terminal of said second or first inverter;
   a fifth MISFET having a drain and a source connected to the other of the source and drain of said third MISFET and the drain of said fourth MISFET, respectively;
   fixed potential supply means for supplying a fixed potential to the source of said fourth MISFET;
   a read selecting signal line connected to the gate of said fifth MISFET;
   a write selecting signal line connected to the gate of said third MISFET; and
   a first write/read signal line connected to the other of the source and drain of said third MISFET;
      each of said first MISFET, said second MISFET, and said third MISFET being a TFT or an SOI transistor.

2. A semiconductor memory cell according to claim 1, further comprising:
   a sixth MISFET having a source and a drain, one of which is connected to an output terminal of said second or first inverter, and a gate connected to said write selecting signal line; and
   a second write/read signal line connected to the other of the source and drain of said sixth MISFET, said sixth MISFET being a TFT or an SOI transistor.

3. A semiconductor memory cell according to claim 2, further comprising:
   a seventh MISFET having a gate and a source which are connected to the output terminal of said first or second inverter and fixed potential supply means, respectively; and
   an eighth MISFET having a source and a drain, one of which is connected to the drain of said seventh MISFET and the other connected to said second write/read signal line, and a gate connected to said read selecting signal line.

4. A semiconductor memory cell according to claim 1, wherein a film serving as the gate of each of said first, second, and third MISFETs is disposed below a film serving as the channel thereof.

5. A semiconductor memory cell according to claim 2, wherein a film serving as the gate of each of said first, second, and third MISFETs is disposed below a film serving as the channel thereof.

6. A semiconductor memory cell according to claim 3, wherein a film serving as the gate of each of said first, second, and third MISFETs is disposed below a film serving as the channel thereof.

7. A semiconductor memory cell according to claim 1, wherein a film serving as the gate of each of said first, second, and third MISFETs is disposed above a film serving as the channel thereof.

8. A semiconductor memory cell according to claim 2, wherein a film serving as the gate of each of said first, second, and third MISFETs is disposed above a film serving as the channel thereof.

9. A semiconductor memory cell according to claim 3, wherein a film serving as the gate of each of said first, second, and third MISFETs is disposed above a film serving as the channel thereof.

10. A semiconductor memory cell according to claim 1, wherein each of said first, second, and third MISFETs has gates disposed above and below the channel thereof.

11. A semiconductor memory cell according to claim 2, wherein each of said first, second, and third MISFETs has gates disposed above and below the channel thereof.

12. A semiconductor memory cell according to claim 3, wherein each of said first, second, and third MISFETs has gates disposed above and below the channel thereof.

* * * * *